United States Patent
Li et al.

(10) Patent No.: US 7,606,826 B2
(45) Date of Patent: Oct. 20, 2009

(54) EVALUATION AND DISPLAY OF TEMPORAL DESCRIPTIONS

(75) Inventors: Chaoji Li, Beijing (CN); Atsushi Kasuya, Los Altos, CA (US); Jianzhou Zhao, Changchun (CN); Baodong Yu, Beijing (CN)

(73) Assignee: Jeda Technologies, Inc., Los Altos, CA (US)

( * ) Notice: Subject to any disclaimer, the term of this patent is extended or adjusted under 35 U.S.C. 154(b) by 254 days.

(21) Appl. No.: 11/633,868

(22) Filed: Dec. 4, 2006

(65) Prior Publication Data

US 2007/0083548 A1    Apr. 12, 2007

Related U.S. Application Data

(63) Continuation-in-part of application No. 11/148,126, filed on Jun. 7, 2005.

(51) Int. Cl.
*G06F 7/00* (2006.01)
*G06F 17/00* (2006.01)

(52) U.S. Cl. ...................................... 707/102; 707/100
(58) Field of Classification Search ......... 707/100–102, 707/104.1, 1; 716/5; 717/143
See application file for complete search history.

(56) References Cited

U.S. PATENT DOCUMENTS

| 6,920,583 | B1 * | 7/2005 | Morley et al. ................. 714/32 |
| 2006/0085774 | A1 * | 4/2006 | Moorby ........................ 716/5 |
| 2007/0294651 | A1 * | 12/2007 | Tsai et al. ...................... 716/5 |

* cited by examiner

*Primary Examiner*—Hung T Vy
*Assistant Examiner*—Merilyn P Nguyen
(74) *Attorney, Agent, or Firm*—Venture Pacific Law, PC

(57) ABSTRACT

Evaluation information of a temporal description is displayed by: structuring data structures into a logical tree structure that is representative of the hierarchy of the temporal expressions, with each tree node representing a temporal primitive operator, and a unique index assigned to each primitive; evaluating the temporal expression, and recording the evaluation trace information that contains the corresponding unique index to the primitive node, the evaluation time stamp, and other information of the evaluation; and selectively displaying an evaluation sequence of the selected result at any level, including from the top of the tree structure of the temporal evaluation in order to show the evaluation history of the selected result at a lower level of the expression tree, where the selection methods include a graphical interface on the screen to select a child expression at a given tree level.

12 Claims, 20 Drawing Sheets

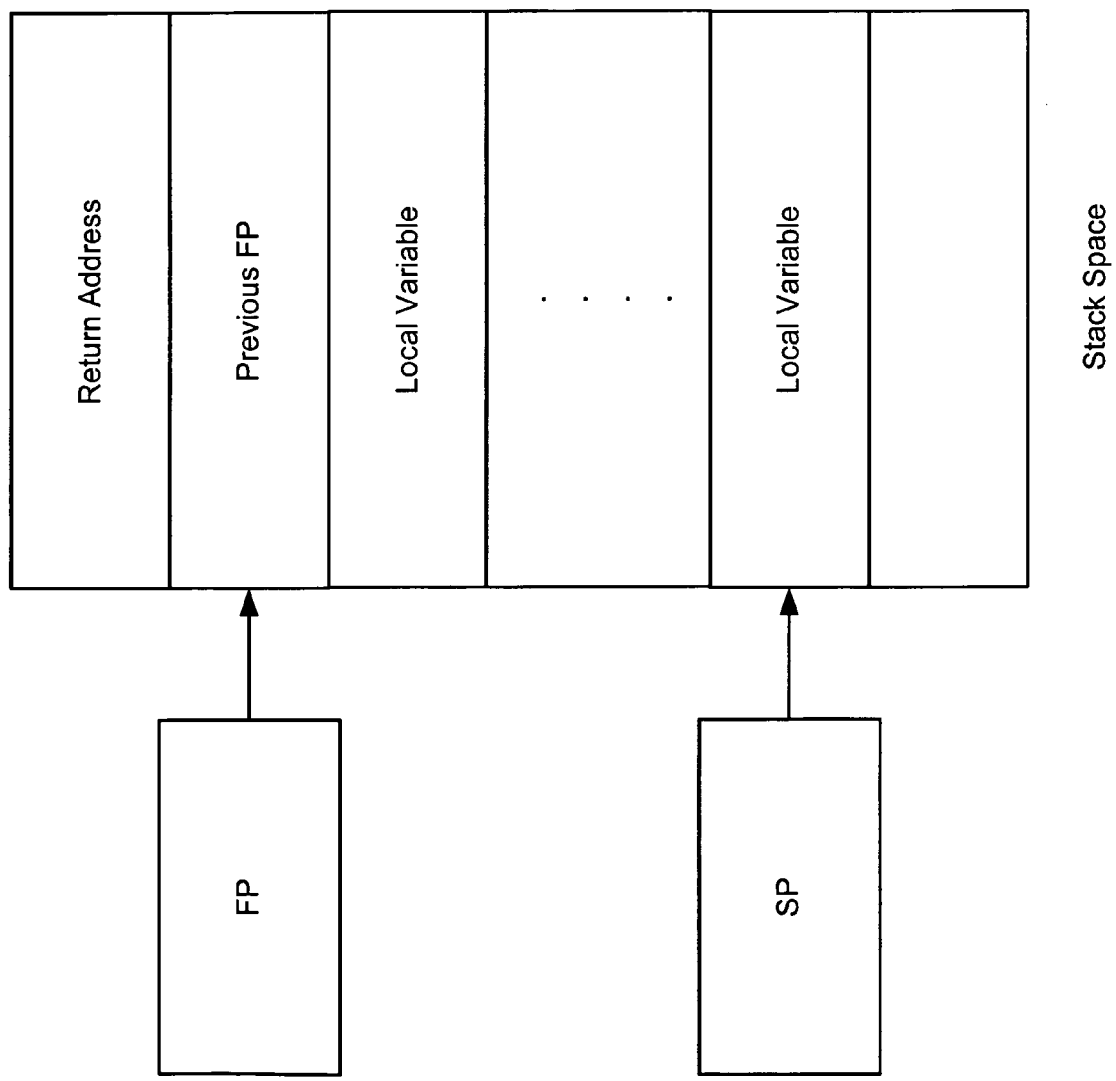

1701

| Index = 1 |
|---|
| Type = AND |
| Node = 1 |

1702

| Index = 2 | Index = 3 |
|---|---|
| Type = DLY | Type = DLY |
| From = 0 | From = 0 |
| To = 1 | To = 1 |
| Node = 2 | Node = 3 |

1703

| Index = 4 | Index = 6 |
|---|---|
| Type = BOOL | Type = BOOL |
| Exp = 'A' | Exp = 'B' |
| Node = 4 | Node = 5 |

| Index = 5 | Index = 7 |
|---|---|
| Type = DLY | Type = DLY |
| From = 1 | From = 1 |
| To = 1 | To = 1 |
| Node = 2 | Node = 3 |

1704

| Index = 5 | Index = 7 |
|---|---|
| Type = DLY | Type = DLY |
| From = 0 | From = 0 |
| To = 0 | To = 0 |
| Node = 2 | Node = 3 |

1705

| Index = 8 | Index = 9 |
|---|---|
| Type = BOOL | Type = BOOL |
| Exp = 'A' | Exp = 'B' |
| Node = 4 | Node = 5 |

< Ready Queue >  Fig. 17  < Delay Queue >

EVALUATION AND DISPLAY OF TEMPORAL DESCRIPTIONS

CROSS REFERENCE

This application is a continuation-in-part of a U.S. patent application entitled "Evaluation of A Temporal Description within a General Purpose Programming Language," filed on Jun. 7, 2005, having an application Ser. No. 11/148,126.

BACKGROUND OF THE INVENTION

1. Field of the Invention

This invention pertains in general to hardware designs functional verification and in particular to techniques for evaluating a temporal description within a general purpose programming language.

2. Background Art

Using a temporal description to verify a hardware design is increasingly common. Hardware description languages such as the Process Specification Language (PSL) are becoming standards to verify hardware designs and various electronic design automation (EDA) tools are beginning to support the evaluation of such a temporal description. For example, a hardware description language such as System Verilog uses the temporal description mechanism to check the correctness of a hardware behavior during hardware simulation. Special purpose programming languages developed for designing hardware can adopt such a new language construct (i.e., temporal description) with an additional syntax.

Another trend of hardware design is to use a general purpose programming language such as C++ to simulate a hardware behavior. In such an environment, users use a general purpose programming language with various hardware modeling support libraries to construct a simulation model to verify hardware behaviors. Because the hardware model is written in a general purpose programming language, it is easy to mix simulation codes, which are constructed using the general purpose programming language with software.

In a general purpose programming language, however, the language syntax cannot be easily changed to support hardware simulation. It is desirable for the general purpose programming language to have a mechanism to evaluate a temporal description during hardware simulation. Moreover, it is desirable that such a mechanism be able to express a temporal description within the context of the general purpose programming language such that the temporal description is constructed with the general purpose programming language's native expression, and that variables used within the temporal description are taken from the name scope of the temporal description's location.

In addition, because the temporal logic mechanism is useful in specifying the sequence of hardware behaviors, it is desirable to use it as an ordinal expression within a general purpose programming language. In such an expression, there will be a mixture of temporal constructs and ordinal expressions. To evaluate such a mixed expression, the ordinal expression is repeatedly evaluated over the program execution. However, the ordinal execution mechanism provided by general purpose programming language compilers cannot handle such a situation.

Therefore, there is a need for a technique that effectively evaluates a temporal description within a general purpose programming language.

Additionally, temporal assertion in hardware verification uses a formal expression to describe the correct behavior of the hardware. Its formal expression is a type of regular expression to express the possible path of the sequence and/or event to occur. This formal description allows the user to express complicated hardware behavior in concise, easy to read expressions.

The formal expression contains many possible concurrent evaluation. It has a capability to describe many possible temporal sequences in one description, and the evaluation of such expression may require many concurrent operations. Thus, even if a concise expression is provided, it may not be so easy to determine if the temporal expression is really correct. Upon an unexpected failure of the evaluation, the user must determine where and how the expression led to a failure.

For debugging a hardware design in using hardware simulation, a waveform viewer is commonly used. The waveform viewer has capability of showing the timeline changes of a static location, such as for a particular signal. But the activity of evaluating a temporal assertion involves many dynamic concurrent operations and it is not possible to show such activities in prior-art waveform viewers.

Some waveform viewer has the capability to show the results of temporal evaluation in a static manner. As the nature of waveform, it is not possible to show the dynamic activities during the evaluation process.

Therefore, there is a need for methods that can effectively evaluate and dynamically displays temporal expressions.

DISCLOSURE OF INVENTION

The above need is met by a translation module that translates a temporal description into a temporal expression. The translation module is adapted to translate a temporal description in the form of an extended syntax or a preprocessing macro to the temporal expression. The temporal expression includes a native expression of a general purpose programming language. The temporal expression may also include one or more construct functions. A parsing module generates a data structure that represents the temporal expression without evaluating the native expression. Particularly, the parsing module is adapted to parse the temporal expression to generate the data structure. During the parse phase, the parsing module creates a data structure, copies a return address in a stack to a data structure for future evaluation. Then it avoids evaluating the native expression during the parse phase by controlling a construct function's return value to be false.

An evaluation module evaluates the data structure to execute the temporal expression including the native expression. For example, the evaluation module returns to the address stored in the data structure instead of the actual return address in the stack and evaluates the native expression by controlling the construct function's return value to be true. The evaluation module also evaluates a variable within the native expression from a name scope of the native expression's program location. According to an embodiment of the invention, the evaluation module creates one or more nondeterministic finite automata (NFA) state structures that include data to be evaluated at one or more clock cycles. The evaluation module stores the one or more NFA state structures in a queue. The evaluation module then retrieves a NFA state structure from the queue in response to the passing of clock cycles to evaluate the retrieved NFA state structure.

Furthermore, the evaluation module generates data for tracing and debugging the evaluation process of temporal assertions. The evaluation of inner constructs is also recorded as well as the overall results. The recorded data can then be displayed using the graphical user interface of the present invention, and the behavior of every part of the temporal assertions can be fully revealed, where the user may selectively display an evaluation sequence of the selected result at any level, including from the top of the tree structure of the temporal evaluation in order to show the evaluation history of the selected result at lower level of the expression tree, where the selection methods include a graphical interface on the screen to select a child expression at a given tree level.

BRIEF DESCRIPTION OF THE DRAWINGS

FIG. 3 is a block diagram illustrating the configuration of an exemplary stack according to an embodiment of the present invention.

FIG. 17 illustrates the activities of the Ready Queue and the Delay Queue during the evaluation process for the sample expression.

The figures depict an embodiment of the present invention for purposes of illustration only. One skilled in the art will readily recognize from the following description that alternative embodiments of the structures and methods illustrated herein may be employed without departing from the principles of the invention described herein.

DETAILED DESCRIPTION OF THE PREFERRED EMBODIMENTS

Figure 1:
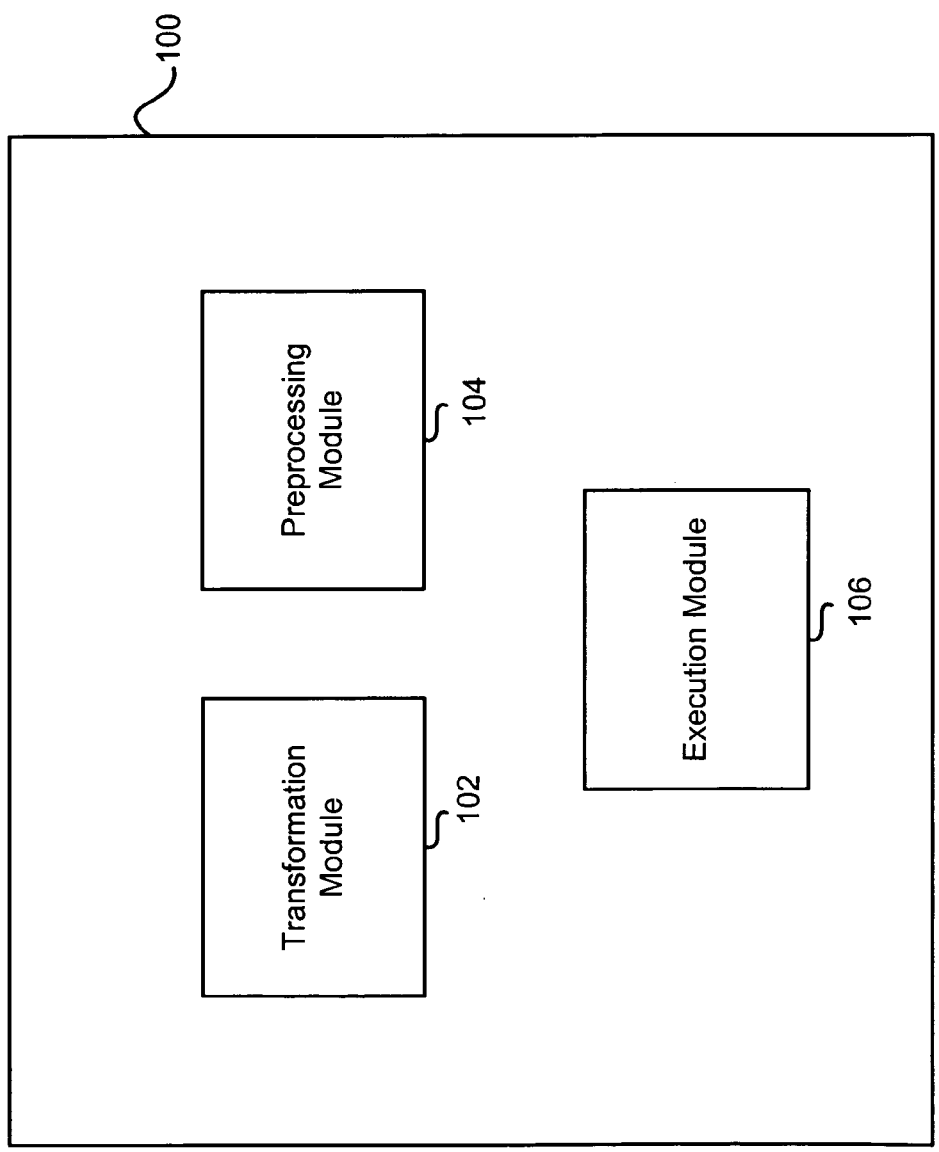
FIG. 1 is a high-level block diagram of a computing environment according to an embodiment of the present invention.

FIG. 1 is a high-level block diagram of a computing environment 100 according to an embodiment of the present invention. FIG. 1 illustrates that the computing environment 100 includes a transformation module 102 (generally referred to as a translation module), a preprocessing module 104 (also generally referred to as a translation module), and an execution module 106. Those of skill in the art will understand that other embodiments of the computing environment 100 can have different and/or other modules than the ones described herein. In addition, the functionalities can be distributed among the modules in a manner different than described herein.

In an embodiment of the invention, a temporal description is written within a general purpose programming language such as C++. The temporal description can be expressed with either an extended syntax or a preprocessor macro. In the case of an extended syntax, the transformation module 102 (e.g., a parser program or a compiler) parses the extended syntax and translates it into the general purpose programming language's native expression. In the case of a preprocessor macro, the preprocessing module 104 (e.g., a preprocessor such as the c preprocessor (CPP)) parses the macro and translates it into the native expression.

As a result of the translation by the transformation module 102 or by the preprocessing module 104, the temporal description is expanded to one or mote construct functions and/or native expressions, which may be connected by one or more logical "and" operators and/or "select" operators.

As an example, the temporal description that "x==5" is true within 0 to 2 cycles may be expressed with the syntax "@[0,2] x==5." This temporal description can also be n presented by the macro "NSC_SEQ(0, 2, NSC_BOOL(x==5))." The transformation module 102 or the preprocessing module 104 then translates the temporal description (either in an extended syntax to be translated by the transformation module 102 or in a preprocessing module to be translated by the preprocessing module 104) into the following temporal expression that includes one or more function calls and native expressions:

NSCA_DLY(0, 2) &&
  (NSCA_BOOL( ) ? ((X==5)? NSCA_TRUE( ): NSCA_FALSE( )): NSCA_END( ))

&&

NSCA_END( )

This exemplary temporal expression includes one or more function calls and/or native expressions. Therefore, this temporal expression can be processed by a general purpose programming language's ordinal compiler. In addition, the temporal expression is a pure expression that can be placed anywhere in a program where an expression can be placed (e.g., as a condition in an "if" statement). Since a native expression is expanded in a program location, the native expression can use a variable that can be accessed at a location of the program where the native expression is expanded. For example, the variable "x" in the native expression above can be a local variable, which is usually not accessible from outside of the program function. Thus, a variable within the native expression can be evaluated from a name scope of the native expression's program location.

In the exemplary temporal description (in the extended syntax form) "@[0,2]x==5," "@[0,2]" is a special temporal expression operator, and "x==5" is a general purpose programming language's native expression. In an embodiment, the transformation module 102 is adapted to translate "@[0, 2]" into the temporal expression:

NSCA_DLY(0, 2) && . . . && NSCA_END( )

Similarly, the preprocessing module 104 is adapted to translate the macro "NSC_SEQ(0, 2,)" into the temporal expression:

NSCA_DLY(0, 2) && . . . && NSCA_END( )

The transformation module 102 is further adapted to translate the; native expression "x==5" into:

NSCA_BOOL( ) ?
((x=5)? NSCA_TRUE( ): NSCA_FALSE( )):
NSCA_END( )

Similarly, the preprocessing module 104 is adapted to translate the macro NSC_BOOL(x==5) into:

NSCA_BOOL( ) ?
((x==5) ? NSCA_TRUE( ): NSCA_FALSE( )):
NSCA_END( )

Thus, the transformation module 102 (if the temporal description is in the extended syntax form) and the preprocessing module 104 (if the temporal description is a macro) are adapted to parse the temporal description into one or more native expressions and function calls that can be understood by a general purpose programming language's compiler. APPENDIX A provides the constructs for various syntax and their translations into a general purpose programming language such as C++. APPENDIX B provides the descriptions of the various construct functions. Both Appendix A and Appendix B are a part of the instant specification.

Figure 2:
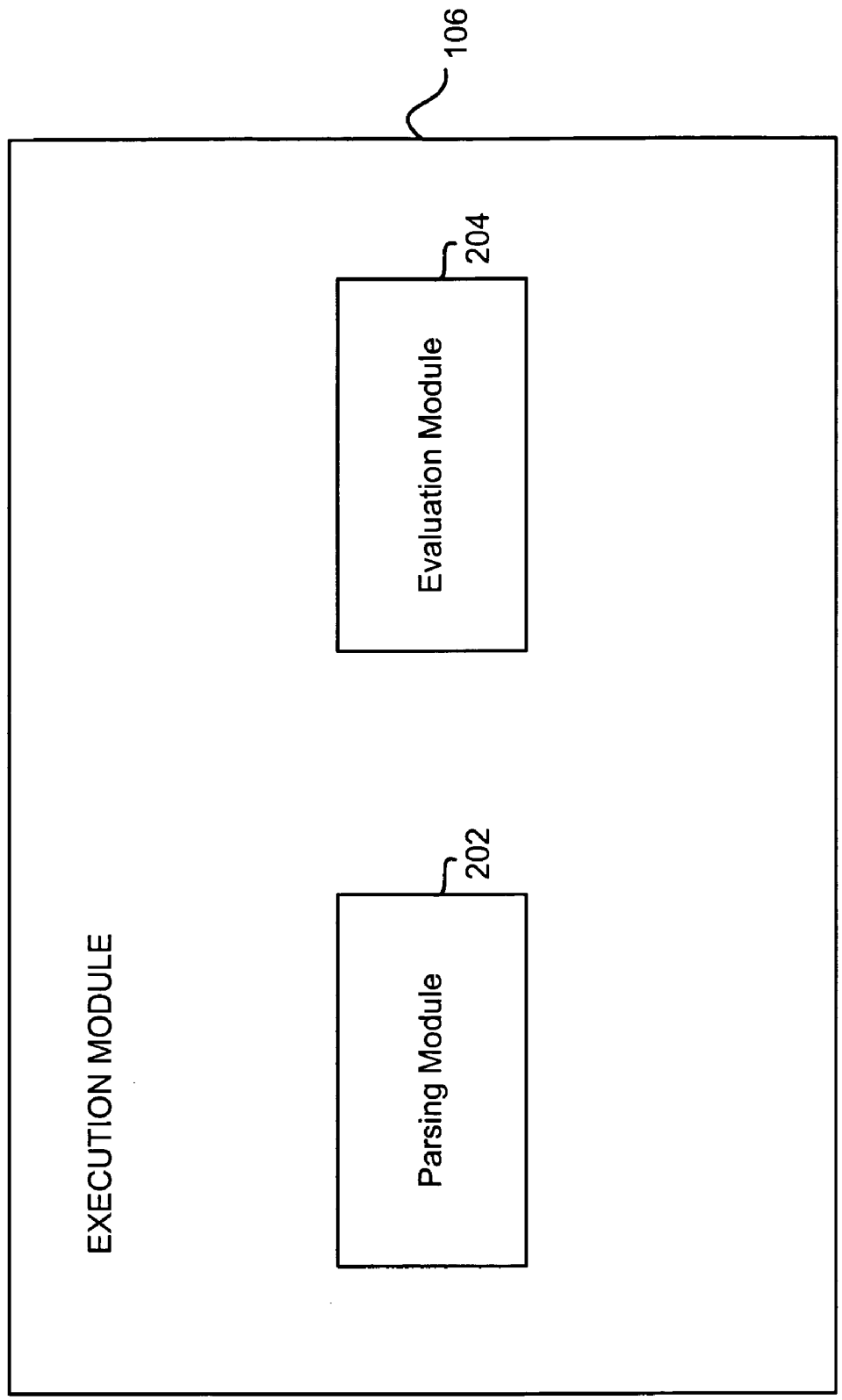
FIG. 2 is a high-level block diagram illustrating modules within an execution module according to an embodiment of the present invention.

In an embodiment of the invention, the execution module 106 is configured to parse the temporal expression generated by the transformation module 102 or the preprocessing module 104 to create a data structure representing the temporal expression. The execution module 106 is further configured to evaluate the created data structure to evaluate and execute the temporal expression. FIG. 2 is a high-level block diagram of the execution module 106 according to an embodiment of the present invention. FIG. 2 illustrates that the execution module 106 includes a parsing module 202 and an evaluation module 204. Those of skill in the art will understand that other embodiments of the execution module 106 can have different and/or other modules than the ones described herein. In addition, the functionalities can be distributed among the modules in a manner different than described herein.

The execution module 106 executes the generated temporal expression in two phases: a parsing phase and an evaluation phase. According to an embodiment of the invention, the parsing module 202 is adapted to parse the temporal expression to generate a data structure without evaluating the native expression within the temporal expression. Evaluating a native expression during the parsing phase is undesirable because the native expression may have side effects (e.g., the native expression "x++=5" increments x during evaluation. Thus, in the example given above, the native expression "x==5" is embedded in the temporal expression generated by the transformation module 102 or the preprocessing module 104 such that the parsing module 202 can avoid evaluating the native expression by controlling the return value of the NSCA_BOOL( ) function to be false. During the parsing phase conducted by the parsing module 202, the NSCA_BOOL( ) function returns false (i.e., "0") so that the "select" operator "T" elects to call the NSCA_END( ) function.

At the parsing phase, the parsing module 202 evaluates the temporal expression and calls one or more construct functions to generate a data structure that represents the temporal expression's logical view. The parsing phase is processed by executing the translated temporal expression as the natural evaluation of the general purpose programming language. As the result, the execution calls various construct functions and transfers control to the parsing module 202. According to the function types, the parsing module 202 generates a data structure representing the temporal expression's logical view.

Various CPU architectures employ various sets of general purpose registers to evaluate the general purpose programming language, and its usage of the registers vary per CPU architecture. But in general, almost all the CPU architectures employ the stack, stack pointer register, and frame pointer register to implement the function call/return mechanism. In this embodiment, we explain the call/return activity based on a virtual CPU architecture with stack, SP (stack pointer register), and FP (frame pointer register). Implementing this scheme into a specific CPU architecture can be easily achieved because of the similarity of call/return mechanism used in various CPU architectures.

When various construction functions are called to transfer the control to the parsing module 202, a general purpose programming language's compiler uses one register as a frame pointer (FP) to identify the function's local variable boundary. A stack pointer (SP) registers one or more points to the end of the stack, and the local variables are located between FP and SP. The function's return address is placed before FP, and the previous FP value is saved in the stack where the FP register is pointing to. This configuration is shown in FIG. 3.

The stack shown in FIG. 3 grows from top to bottom, and SP points to the last valid entry in the stack space. FP points to the start point of the local variable. And the previous FP value is saved at the stack pointed to by FP. In such a configuration, the function is returned as:

SP=FP (copy FP to SP)

FP=Stack[SP--] (pop the operation from the stack and recover the previous FP value)

PC=Stack[SP--] (pop the return address to the program counter (PC))

In such an execution mechanism, the function return address can be read from the stack frame. The actual returning address can also be modified by writing a different value to the return address location in the stack frame (e.g., by using an assembly code). APPENDIX C provides four assembler functions used to execute a temporal expression. Appendix C is a part of this specification.

As discussed, the transformation module 102 or the preprocessing module 104 translates the temporal description that "x==5" is true within 0 to 2 cycles into:

NSCA_DLY(0, 2) &&
(NSCA_BOOL( ) ? ((X==5)? NSCA_TRUE( ): NSCA_FALSE( )):

NSCA_END( ))

&&

NSCA_END( )

During the parsing phase, the parsing module 202 calls the construct functions in the following order:

NSCA_DLY(0, 2)

NSCA_BOOL( )

NSCA_END( )

NSCA_END( )

However, the parsing module 202 does not evaluate the expression "((X==5)? NSCA_TRUE( ): NSCA_FALSE( ))" because the NSCA_BOOL( ) function returns false or "0" during the parsing phase. After the parsing module 202 completes the parsing phase, it evaluates the temporal expression and constructs a data structure. An exemplary data structure constructed by the parsing module 202 for the exemplary temporal expression is shown in FIG. 4A.

Figure 4A:
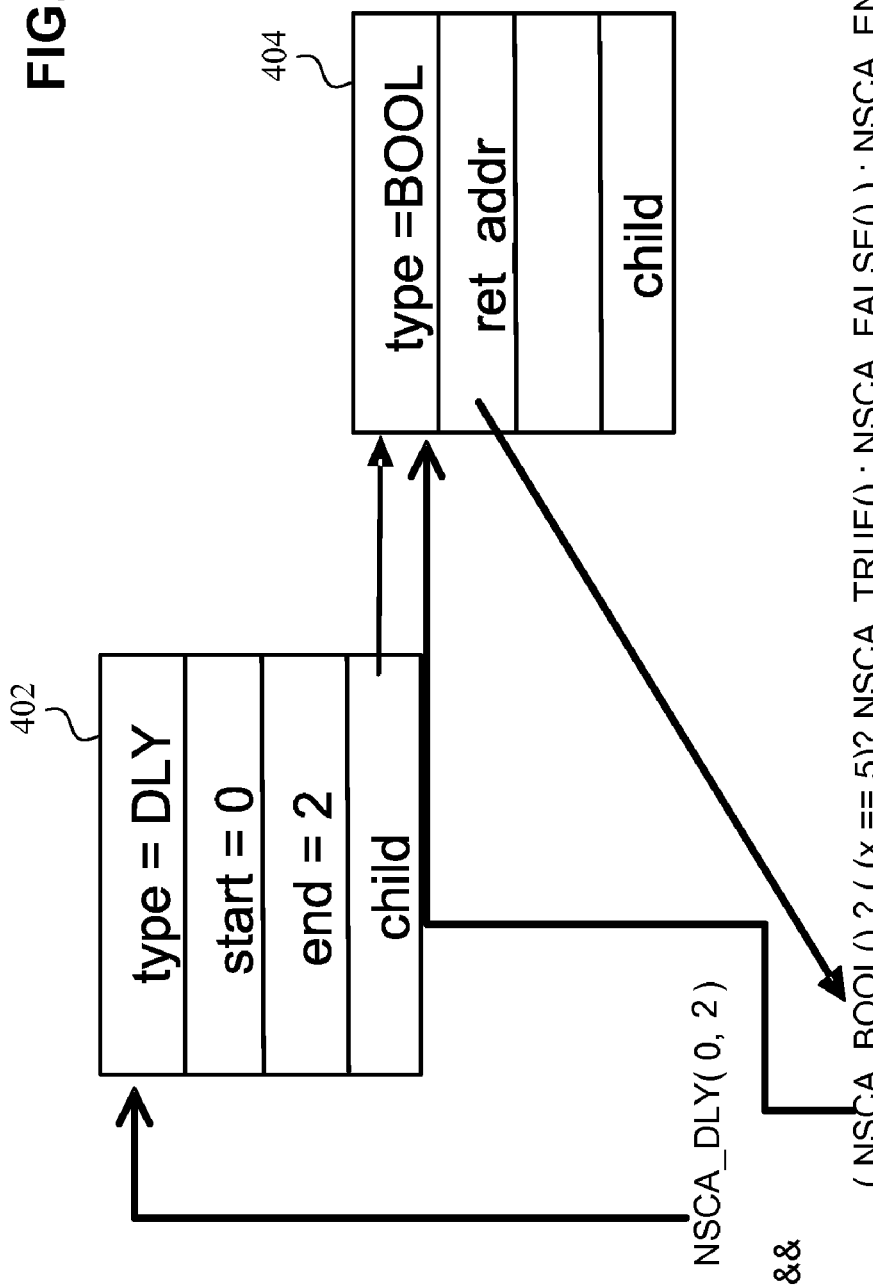
FIGS. 4A and 4B are block diagrams illustrating the parsing of an exemplary temporal expression according to an embodiment of the present invention.

As shown in FIG. 4A, the NSCA_DLY( ) function creates a structure 402 having a DLY (delay) type, and the structure holds the start and end cycle value. The structure is coupled to its child until the corresponding NSCA_END( ) function is called. The NSCA_BOOL( ) function creates a structure 404 having a BOOL type. The return address from the NSCA_BOOL( ) function is kept in the structure for future evaluation.

If the parsing module 202 detects that the NSCA_END( ) function closes the top level structure, it knows that the entire temporal expression has been parsed. Accordingly, the evaluation module 204 can evaluate the constructed data structure that represents the temporal expression.

Figure 4B:
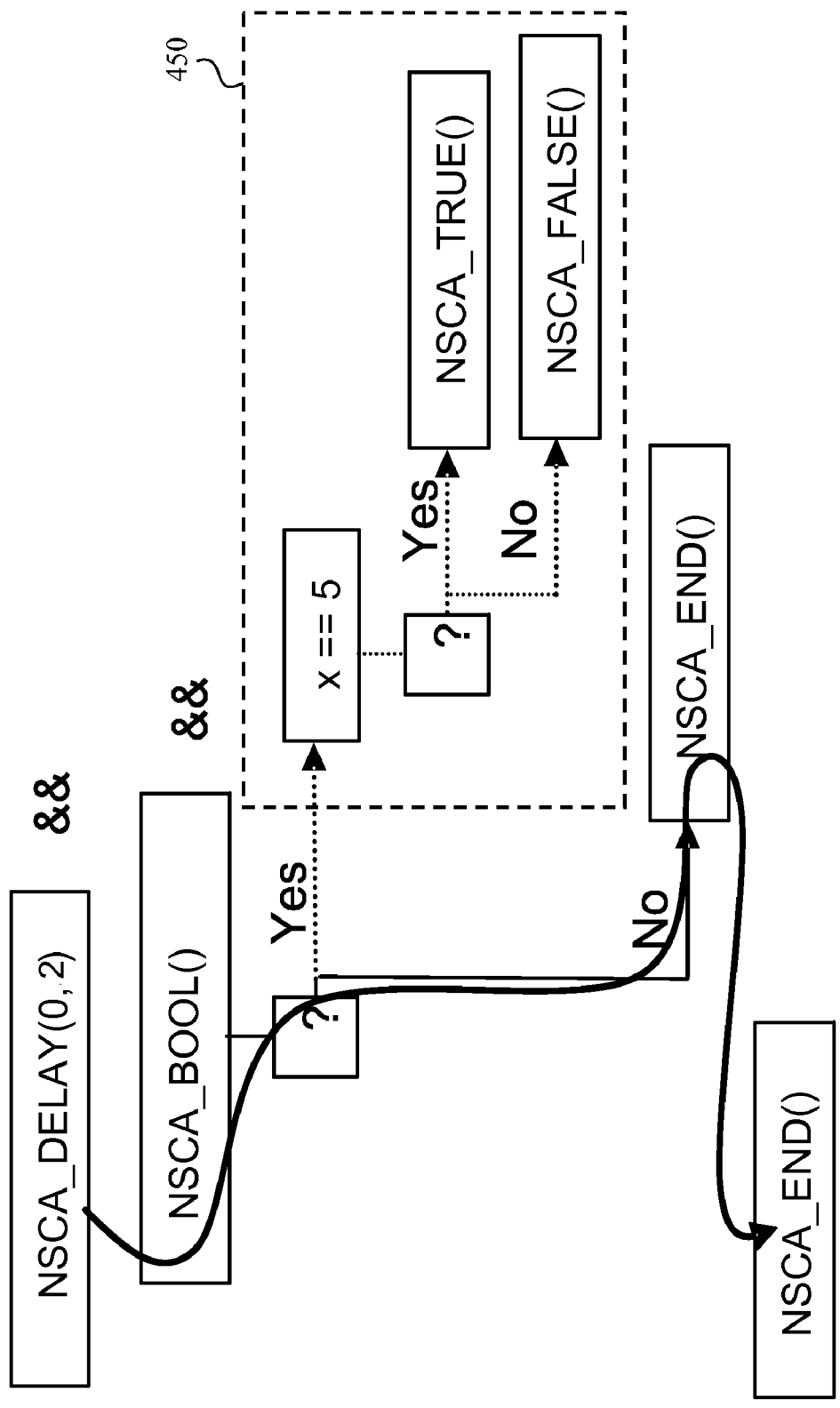

FIG. 4B illustrates the execution path during the parsing phase. As shown, the NSCA_BOOL( ) function returns false or "0" in response to capturing the return address such that the native expression "x==5" is not evaluated 450.

In an embodiment of the invention, the evaluation module 204 evaluates the temporal expression using an NFA mechanism. Specifically, the evaluation module 204 constructs another data structure representing an active state within an NFA. In such an implementation, the evaluation module 204 creates a bubble (i.e., the NFA state structure) that points to the top data structure. The evaluation module 204 places the bubble in an active queue to be evaluated. The evaluation module 204 then processes one or more bubbles in the active queue. The evaluation module 204 can place a bubble in a delay queue if the bubble is to be delayed for one or more cycles. APPENDIX D provides a description of the NFA mechanism for evaluating a temporal expression. Appendix D is a part of this specification.

Figure 5:
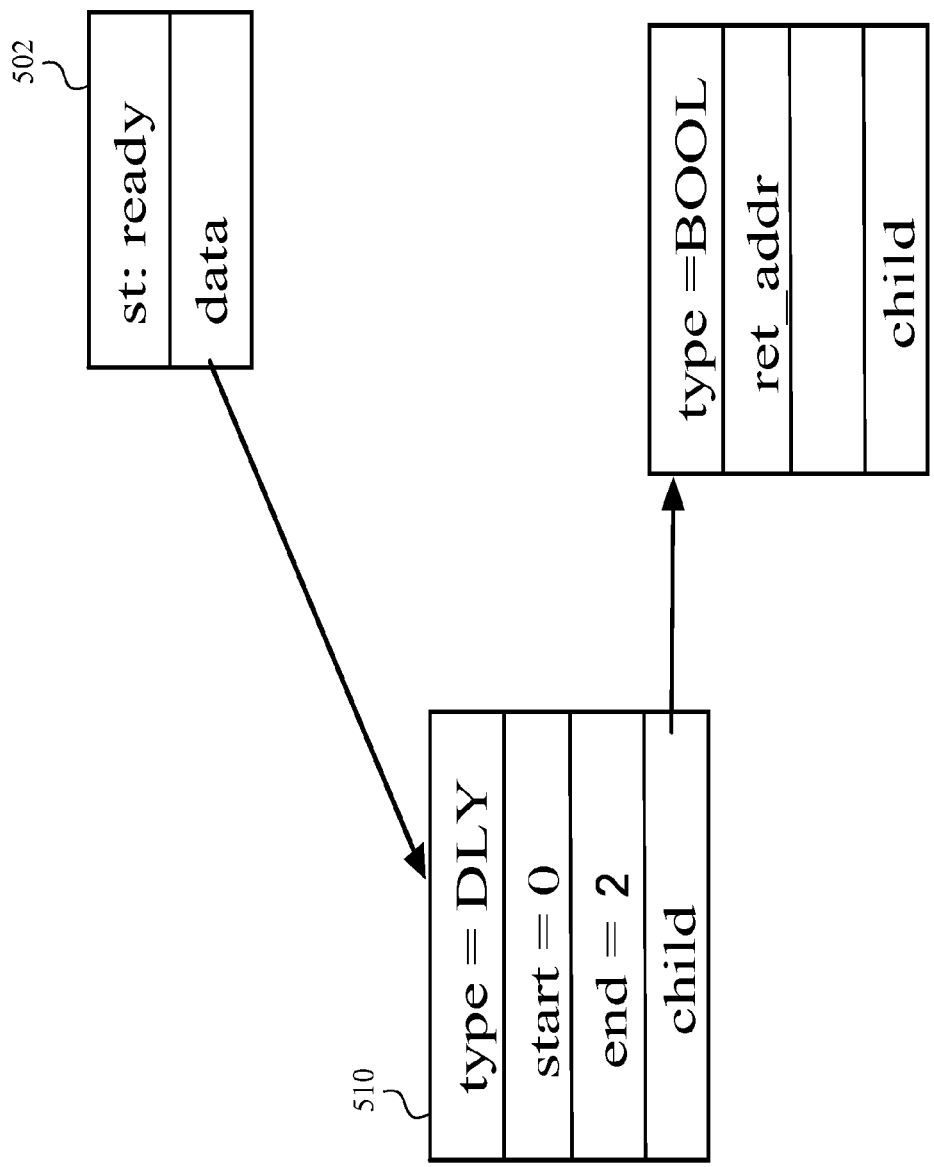
FIGS. 5-8 are block diagrams illustrating the evaluation of an exemplary temporal expression according to an embodiment of the present invention.
Figure 6:
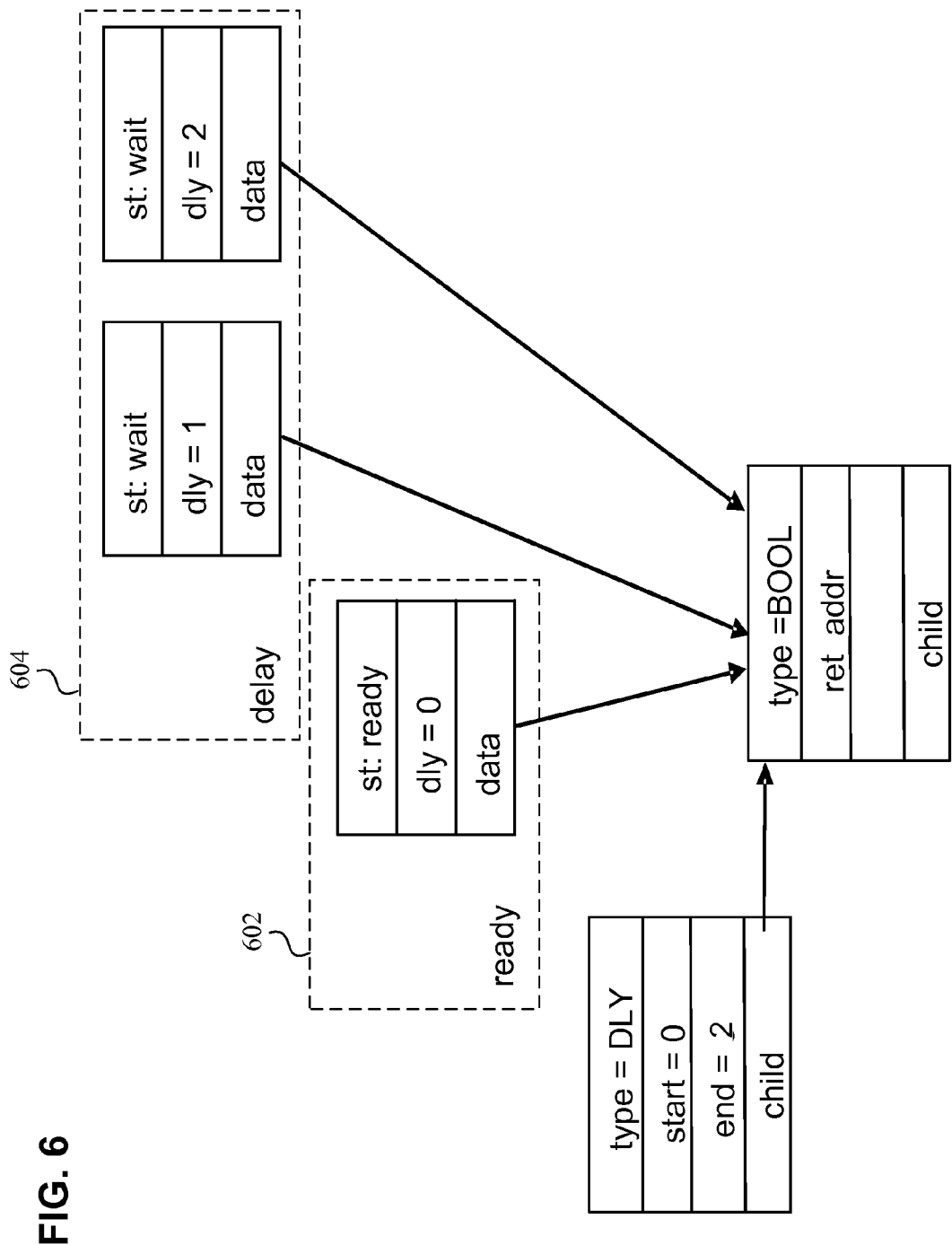

FIGS. 5-8 illustrate the evaluation mechanism for the exemplary temporal expression. As shown in FIG. 5, the evaluation module 204 creates an initial bubble 502 pointing to the DLY type structure 510. As shown in FIG. 6, in response to the evaluation module 204 evaluating the initial bubble 502 pointing to the DLY type structure, with start=0 and end=2, the initial bubble produces three bubbles 602, 604, 604, with 0 to 2 delays. The bubble with 0 delay stays in a ready queue for immediate evaluation by the evaluation module 204. Other bubbles are placed in a delay queue and reactivated (e.g., placed in the ready queue) in response to the passing of clock cycles.

Figure 7:
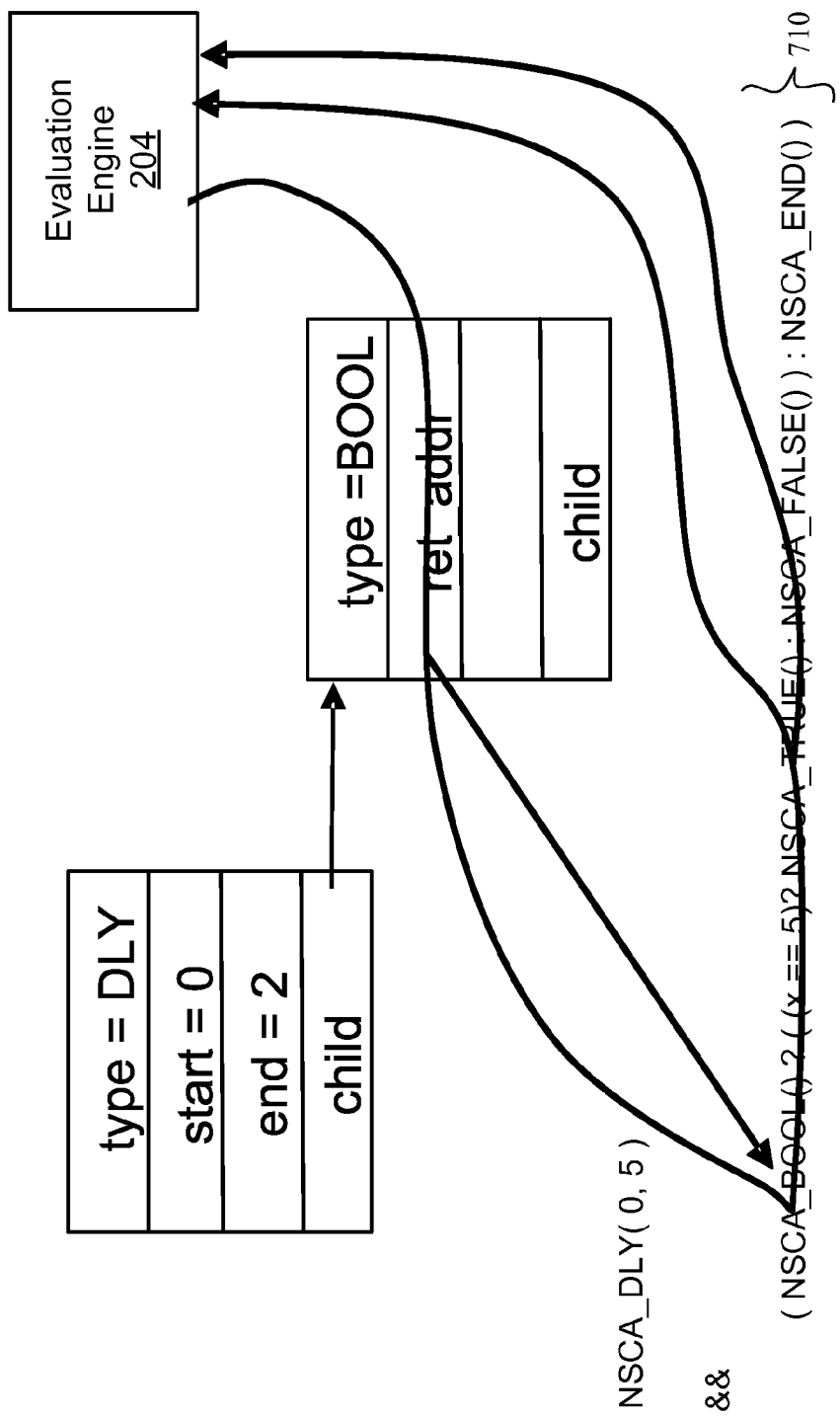

In FIG. 7, the evaluation module 204 evaluates the ready bubble 310 pointing to the BOOL type structure. Since the evaluation module 204 is run within the last NSCA_END( ) function 710, the evaluation module 204 can execute the Boolean expression by returning to the address stored in the "ret_addr" field of the data structure, with the return value of "1." This has the same effect as returning from the NSCA_BOOL( ) function within the expression, with the return value of "1." The evaluation module 204 then proceeds to the "select" operator "?" and evaluates the native expression "x==5." Depending on the result of this evaluation, the evaluation module 204 calls the NSCA_TRUE( ) function or the NSCA_FALSE( ) function and obtains the result condition. The evaluation module 204 records the result condition to be used as the final evaluation result.

Figure 8:
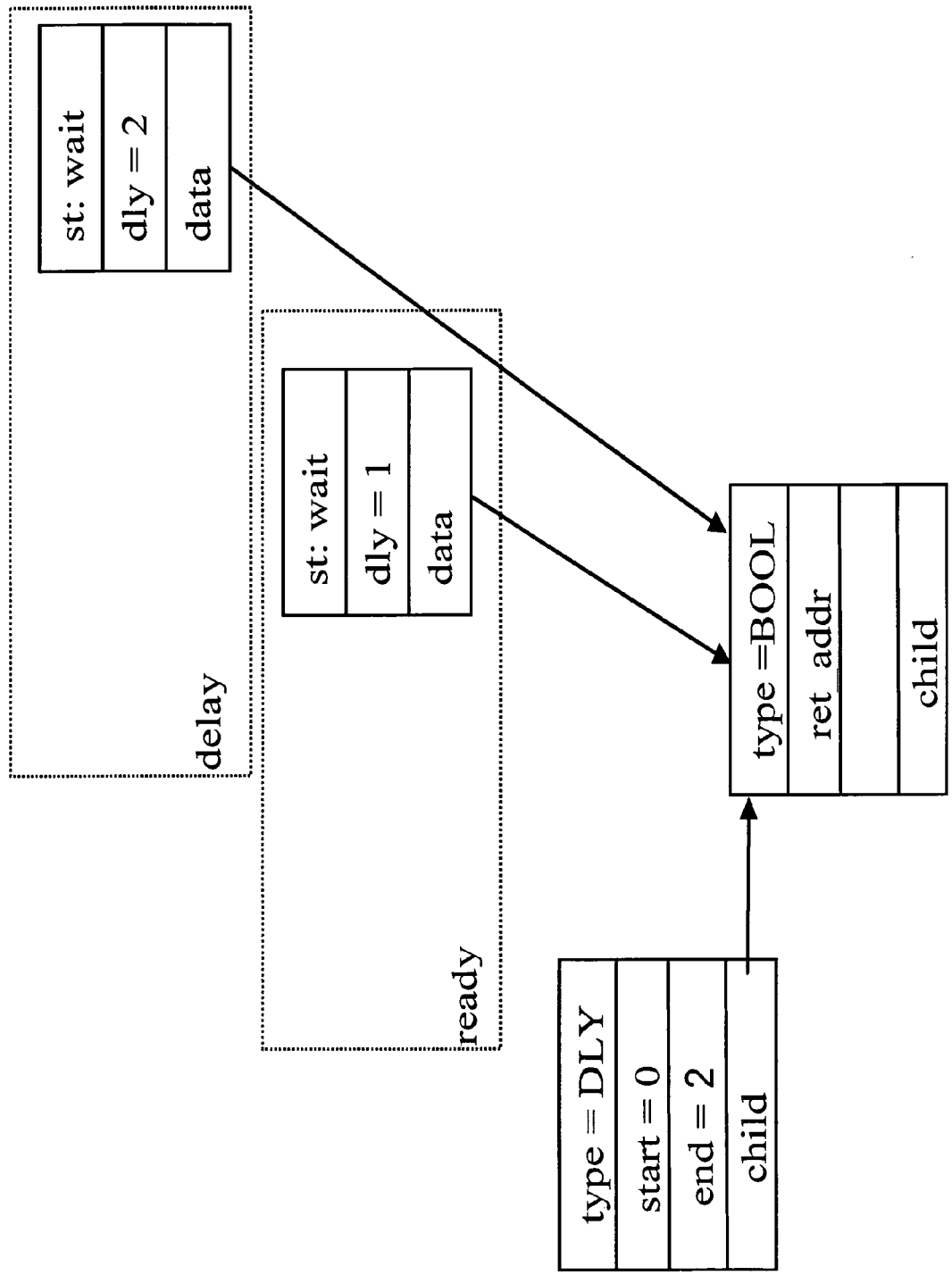

As shown in FIG. 8, at the next cycle, the subsequent bubbles in the wait queue become active, and the evaluation module 204 executes the same Boolean evaluation. The evaluation module 204 completes the evaluation if bubbles are completed and removed from the ready queue and the delay queue. The evaluation module 204 thus returns to the last NSCA_END( ) function address with the proper evaluation result.

Figure 9:
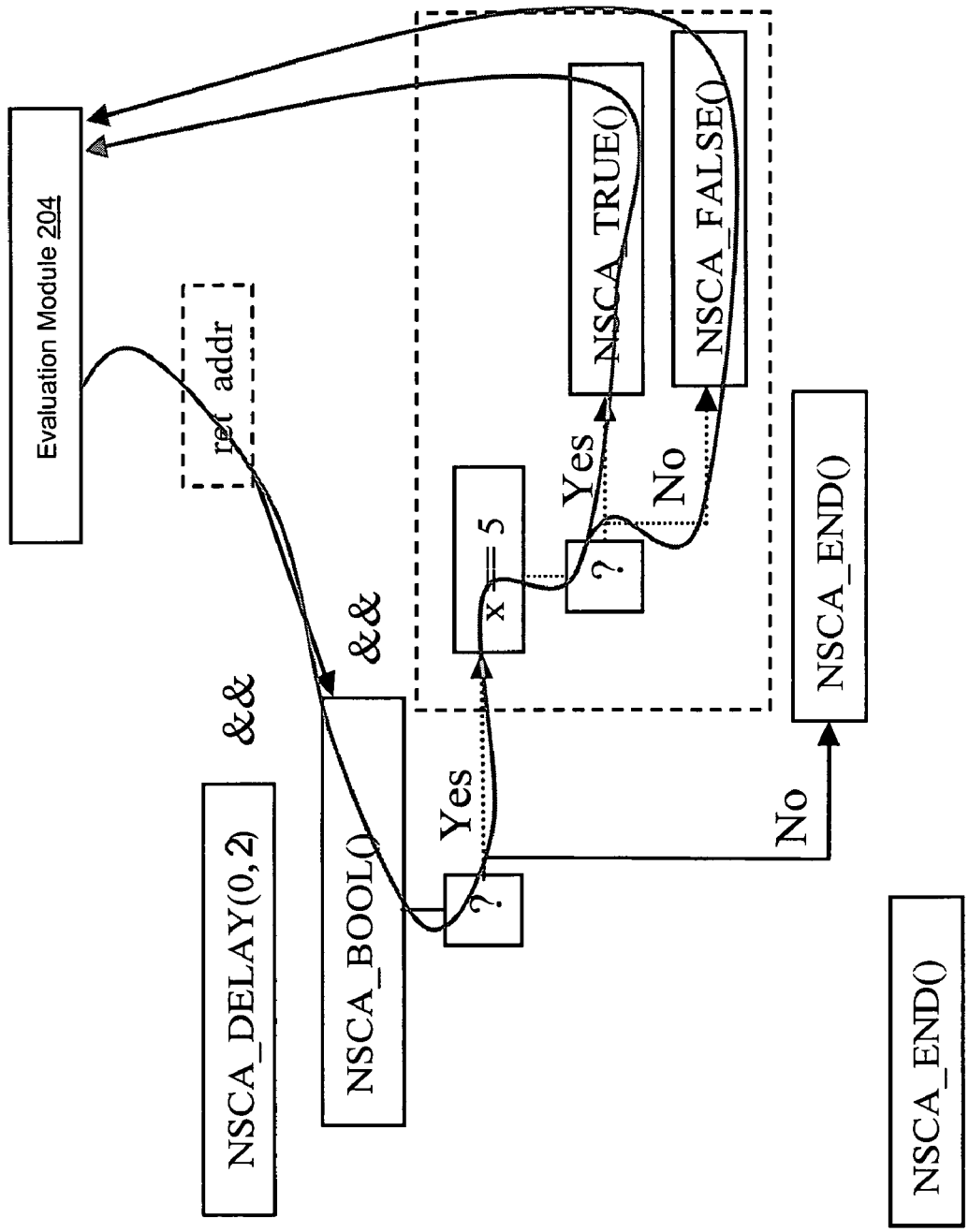
FIG. 9 is a block diagram illustrating the execution path for an exemplary temporal expression during the evaluation phase according to an embodiment of the present invention.

FIG. 9 illustrates the execution path for the exemplary temporal expression during the evaluation phase. As shown, during the evaluation phase, the NSCA_BOOL( ) function's return address is kept as the evaluation address of the native expression "x==5" 450. If the evaluation module 204 evaluates the Boolean expression, it sets the return address and returns to the evaluation point. The result is transferred back to the evaluation module 204 after the evaluation.

APPENDIX E provides the various functions that may be executed during the parsing phase and the evaluation phase. Appendix E is a part of this specification.

With this evaluation mechanism, a temporal expression can be embedded as an ordinal expression in a general purpose programming language. A native expression used within the temporal expression can use a variable within the scope of the embedded point. The text below provides an exemplary code in a general purpose programming language.

```
void foo( ) {
    int x, y;
    ..
    if( @[3,5] data == x) {
        ..
    }
}
```

In the exemplary code above, the temporal description "@[3,5] data==x" can be used as a condition of the "if" statement, and the local variable "x" can be used in a temporal expression. The transformation module 102 or the preprocessing module 104 is configured to translate this exemplary code into the form of "NSCA_DLY(3, 5) && . . . && NSCA_END( )" that is acceptable in a general purpose programming language's syntax.

In another example, the transformation module 102 or the preprocessing module 104 is adapted to translate a property expression and a sequence expression into the following form:

NSCA_CALL && (<function call>) && NSCA_CALL_END( )

The corresponding property function has the structure of void

```
property_name ( <arguments>) {
    <local_variable_declarations>
    NSCA_PROP_BEGIN( );
    <property expression>
    NSCA_PROP_END ( );
}
```

The corresponding sequence function has the structure of:

```
int <sequence name> (<arguments>) {
    <variable declaration>
    NCSA_SEQ_BEGIN( );
    <sequence expression>
    NCSA_SEQ_END( );
}.
```

During the parsing phase, if the NSCA_CALL( ) function is called, the data structure that represents the subroutine call is created, and the return address of the NSCA_CALL( ) is recorded as the evaluation point of the subroutine. The NSCA_CALL( ) function then returns "1," and the evaluation module 204 calls the corresponding sub-function.

Within the sub-function, in response to the local variable being created in the stack frame, either the NSCA_PROP_BEGIN( ) function or the NSCA_SEQ_BEGIN( ) function is called. Within the function, a new structured (coupled under the call structure created by the NSCA_CALL( ) function) and a copy of the local variable are created. This is accomplished by creating a copy of the current stack call frame (e.g., a copy from the FP to the current SP). The parsing module 202 then parses the property expression or the sequence expression within the corresponding function during the parsing phase. The parsing module 202 further constructs the property or sequence structure under the current function structure.

Figure 10:
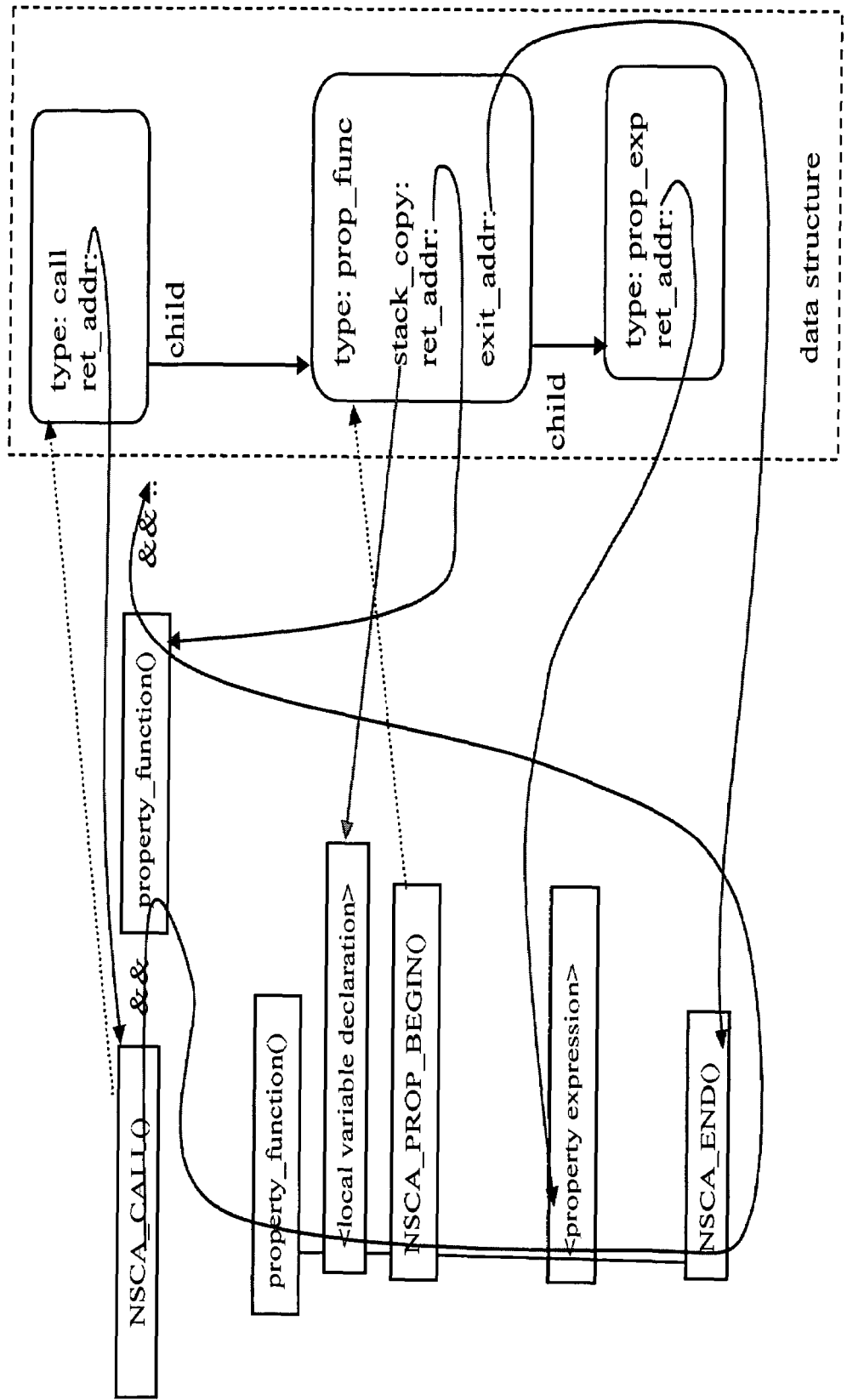
FIG. 10 is a block diagram illustrating the execution path for an exemplary expression during the evaluation phase according to an embodiment of the present invention.

FIG. 10 illustrates the execution path for the property or sequence expression during the evaluation phase. During the parsing phase, the parsing module 202 creates a data structure that represents the property or sequence expression. The data structure is linked to represent the hierarchy of the expression. Each data structure has the type field to show the type of the data structure and holds the return address to exit from the hierarchy. For the property function structure, the stack frame copy is held to keep the local variable's value for iterative execution.

Figure 11:
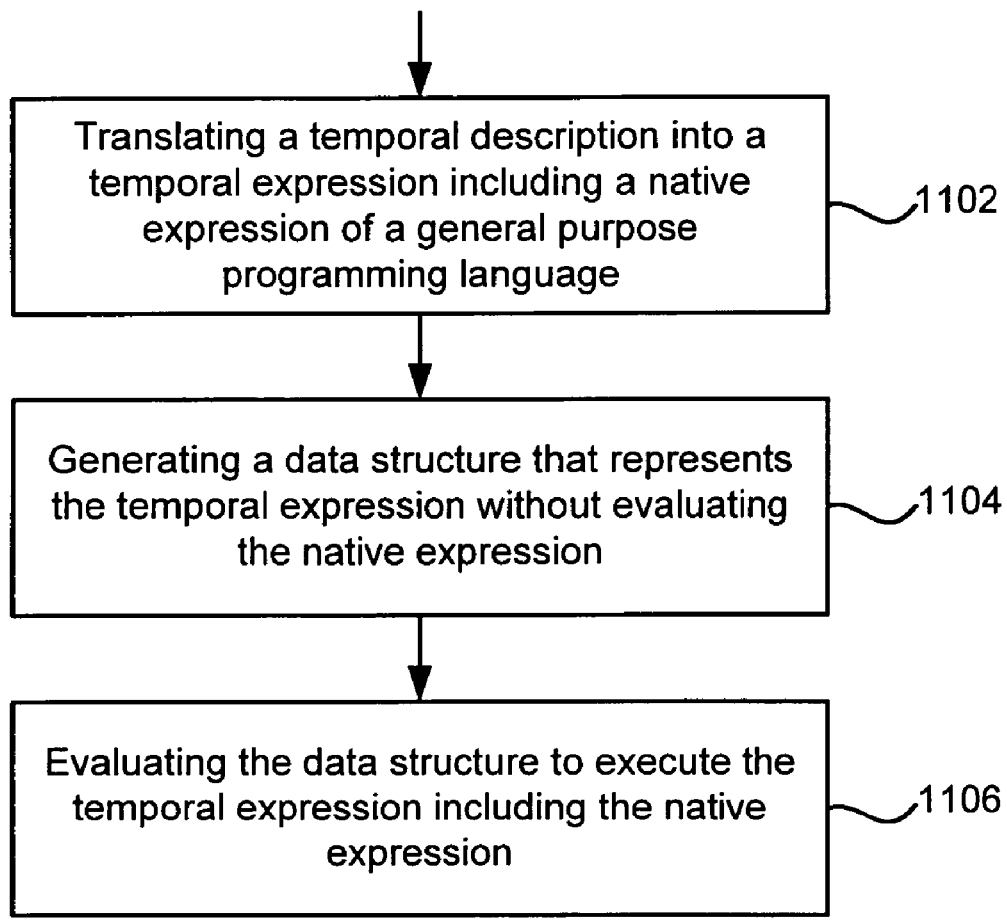
FIG. 11 is a flowchart illustrating steps performed by a computing environment according to an embodiment of the present invention.

FIG. 11 is a flowchart illustrating steps performed by the computing environment 100 according to an embodiment of the invention. The figure omits some possible steps. In addition, some embodiments perform different steps in addition to, or instead of, the ones described herein. Furthermore, the order of the steps can vary from that described herein.

A translation module translates 1102 a temporal description into a temporal expression. For example, the transformation module 102 translates a temporal description in the form of an extended syntax into the temporal expression. Alternatively, the preprocessing module 104 translates a temporal description in the form of a preprocessing macro into the temporal expression. The temporal expression includes a native expression of a general purpose programming language. The temporal expression may also include one or more construct functions.

The parsing module 202 generates 1104 a data structure that represents the temporal expression without evaluating the native expression. Specifically, the parsing module 202 is adapted to parse the temporal expression to generate the data structure. To generate the data structure, the parsing module 202 stores a return address in a stack and avoids evaluating the native expression by controlling a construct function's return value to be false.

The evaluation module 204 evaluates 1106 the data structure to execute the temporal expression including the native expression. For example, the evaluation module 204 returns to the return address stored in the stack and evaluates the native expression by controlling the construct function's return value to be true. The evaluation module 204 also evaluates a variable within the native expression from a name scope of the native expression's program location. According to an embodiment of the invention, the evaluation module 204 creates one or more NFA state structures that include data to be evaluated at one or more clock cycles. The evaluation module 204 stores the one or more NFA state structures in a queue. The evaluation module 204 then retrieves a NFA state structure from the queue in response to the passing of clock cycles to evaluate the retrieved NFA state structure.

Data Structure for and the Recording of Trace Information

Here, this aspect of the present invention describes methods for the recordation of assertion-evaluation information and the viewing of the assertion-evaluation information. When the option for the debugging or tracing of the assertion-evaluation information is turned on, the processing steps for the assertion expressions as well as the evaluation process will be recorded and dumped into a trace file. The trace information (in the trace file) then serves as the database for creating the assertion debug view where the evaluation process can be viewed via a graphical interface. Using of the trace information is also known as offline checking.

The evaluation of an assertion can be separated into a series of attempts. Each attempt can be further divided into sub-expression evaluations. Thus the evaluation history is formed by activities such as begin or end of sub-expressions, matches, and unmatches of sub-expression evaluations. As described above, these activities can be recorded during simulation, dumped into trace files and the trace information can be used to produce a replay of the assertion evaluation history. In an alternative method, trace information produced in real time can be displayed in real time (online checking).

Here, the preferred methods for the recordation of the assertion evaluation information is first discussed. To record and evaluate the logical representation of the temporal expression, the temporal expression that the user defined is translated into a tree structure with primitive nodes, where each node in the tree structure represents a primitive operation of the temporal evaluation. The following table shows certain ones of the primitives and its temporal property. As shown in the table, certain primitive types require a one-child node, and certain primitive types require a two-child node, depending on its respective operation. The bool type primitive evaluates its boolean expression, so it does not have any child node.

| Type | Number of child node | Operation |
| --- | --- | --- |
| ALWAYS | 1 | evaluate its child as a sequence at every clock edge |
| IMPLY | 2 | evaluate child-a, and if true, evaluate child-b |
| AND | 2 | evaluate 'AND' operation of child-a and child-b |
| OR | 2 | evaluate 'OR' operation of child-a and child-b |
| DLY | 1 | delay the given cycle and evaluate its child |
| BOOL | 0 | evaluate the boolean expression |

As explained above, the evaluation over the constructed tree data structure can be done with another data structure 'bubble' that represents the active evaluation point in the expression tree. The initial bubble that points to the top of the tree is created at the beginning of the evaluation, and evaluation is done along with clock. A new bubble may be created according to the operation of the primitive. For example, an 'and' operation will create two new bubbles for child-a and child-b to get the 'and' result of them. Each bubble has an unique index to identify itself. Every time when a new bubble is created, the information of the bubble creation is recorded to the trace file. The information includes the index, the index of the expression node that the bubble points to, the parent bubble (if any), and the created simulation time.

In order to process the temporal evaluation, three types of queue for the bubble are used in the flow. The first type of queue is the Ready queue where bubbles that are ready for evaluation are placed here. The second type of queue is the Delay queue where bubbles that are waiting for cycle delay are placed here. The third type of queue is the Wait queue where bubbles that are waiting for child completion are placed here.

Figure 12:
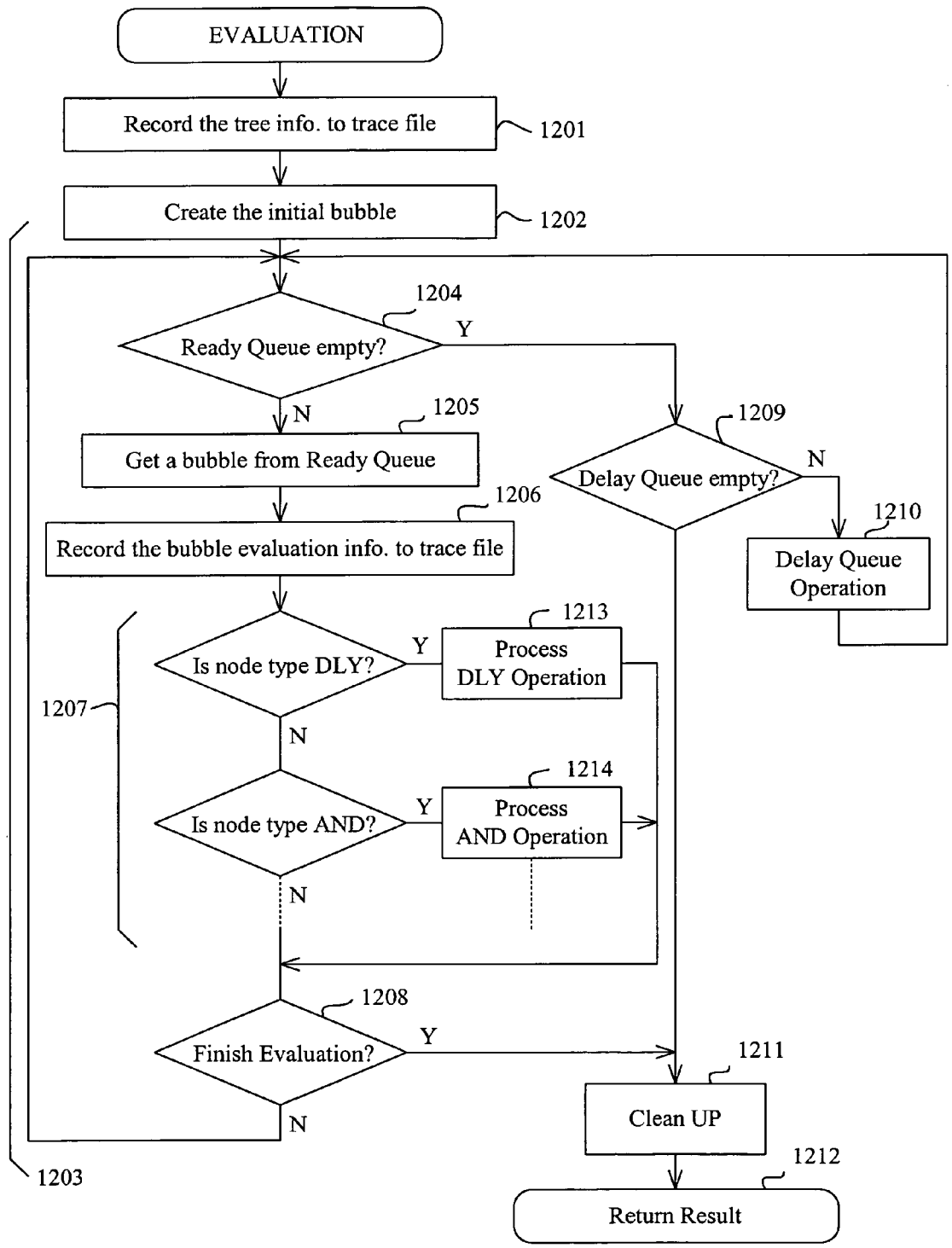
FIG. 12 illustrates a flow chart for the evaluation process.

FIG. 12 illustrates a flow chart for the evaluation process. This flowchart starts after the temporal expression is parsed, and the expression data structure is constructed. At 1201, the information of the tree structure that represents the temporal expression is written to the trace file, where the information contains the type, index, and the tree structure (parent-child relations). At 1202, the initial bubble that points to the very beginning node at the top of the tree is created and put in to the Ready Queue. The bubble creation information is recorded to the trace file. The steps indicated by 1203 is the evaluation loop, and is active until the evaluation of the temporal expression is completed.

At 1204, the ready queue is checked, and if it is empty the process moves to the Delay Queue check at 1209. At 1205, the Ready Queue is not empty, so a bubble is taken from the Ready Queue. At 1206, the trace information is created for bubble evaluation. The information includes the type of node primitives, index of the bubble itself, index of the tree node this bubble is pointing to, simulation time, and other evaluation information.

At the steps indicated by 1207, a proper operation for each node type is selected and executed. At 1208, the completion of the evaluation is checked. The completion can be detected when a completion flag is provided during the primitive operation. At 1209, if Delay Queue is not empty, it moves to the delay operation at 1210. At 1210, depending on the wait period required for the bubbles in the Delay Queue, it waits for the duration of the necessary cycle, then the bubble that completed the wait duration is put in to the ready queue.

At 1211, before returning to the caller, the evaluation queue is cleaned to remove the bubbles that still remains in queues. At 1212, it returns to the caller, with a return value (True or False) according the evaluation result. The evaluation result can be kept in the variable 'Result'.

To understand the evaluation process of the primitives, the actual operation of DLY and AND primitives are shown.

Figure 13:
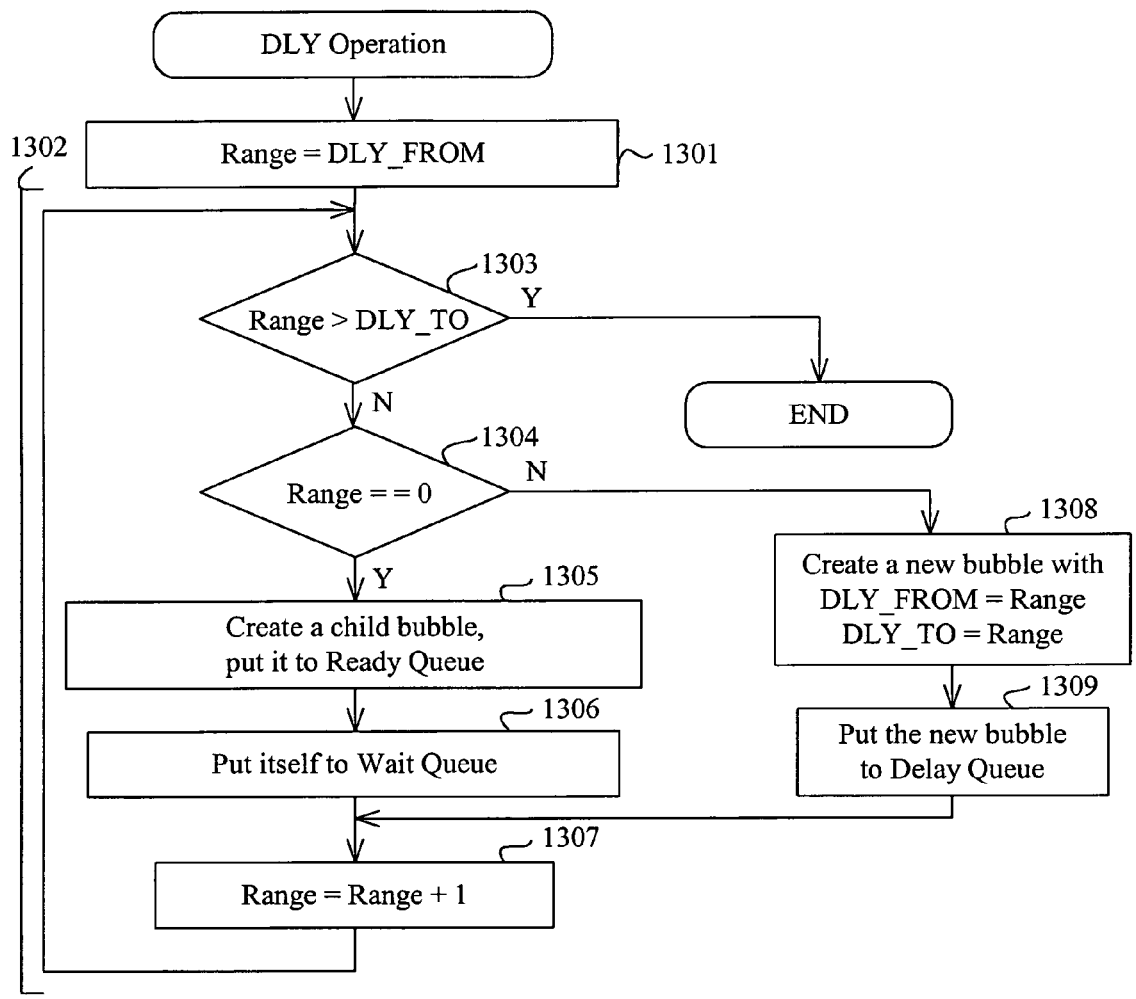
FIG. 13 illustrates the flowchart for the processing of the DLY operation.

FIG. 13 shows the flowchart of the DLY operation indicated at 1213. Here, the delay range specified as @[m:n] (between m to n cycle) are kept in the DLY expression node, and copied to the variables DLY_FROM and DLY_TO on the bubble structure when it is newly created, as:

DLY_FROM=m; DLY_TO=n;

These are the variables attached to the DLY expression node. Within the DLY operation, a local variable 'Range' is used to keep the current delay number. At 1301, DLY_FROM is stored in Range as the initial value of the loop. The steps indicated at 1302 is the loop to process the range set by DLY_FROM and DLY_TO. At 1303, it is checked to see if the variable Range exceeds the value of DLY_TO. If so, the DLY operation is finished.

At 1304, it checks if Range is 0, which means the child can be immediately evaluated. At 1305, as is determined that Range is 0, a new bubble is created that points to the node of its child. Then the child bubble is put into the Ready Queue for evaluation. At 1306, it puts itself (this particular DLY operation) to the Wait queue to wait for the child evaluation to complete. At 1307, Range is incremented, and the process goes back to 1303 for completion check. At 1308, this is the case that Range equals 0, so it needs the Delay Queue operation. It creates a copy of the DLY bubble, with DLY_FROM=Range, DLY_TO=Range. At 1309, the new DLY bubble is put into the Delay Queue for the Delay Queue operation.

With the operation shown in FIG. 13, if the DLY bubble with range [0:2] is processed, the DLY bubble itself is placed to Wait Queue with its child bubble in Ready Queue, and newly copied two bubbles, first with (DLY_TO=DLY_FROM=1), second with (DLY_TO=DLY_FROM=2) are placed into Delay Queue.

Figure 14:
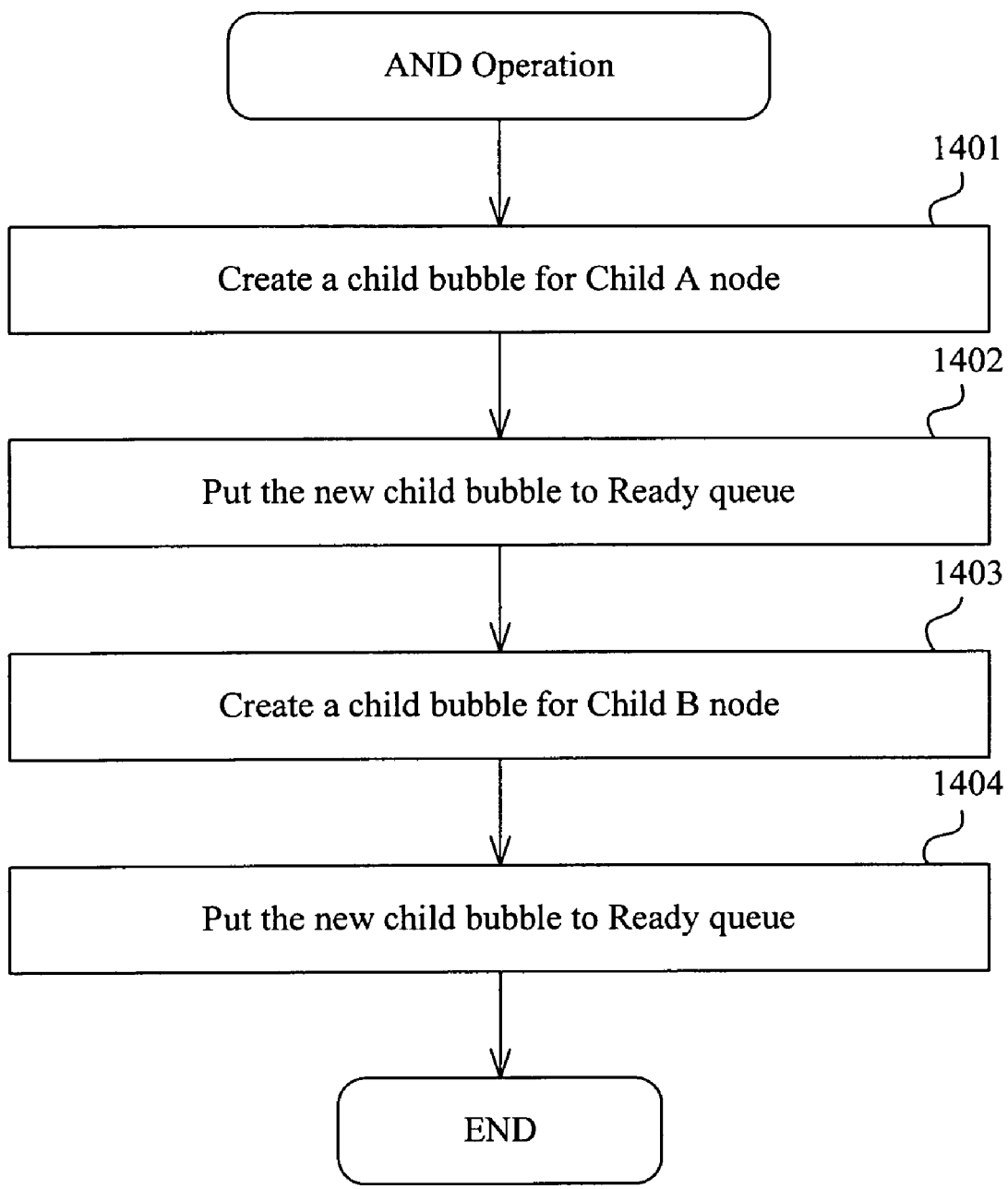
FIG. 14 illustrates a flowchart for the AND operation.

FIG. 14 illustrates a flowchart for the AND operation. Here, at 1401, a new bubble for child-A (one side of the AND node) is created. At 1402, the new bubble is put into the Ready Queue. At 1403, a new bubble for child-B (the other side of the AND node) is created. At 1404, the new bubble is put into the Ready Queue.

When a BOOL primitive is evaluated, it evaluates the pure (non-temporal) expression, and determines the result value to be either True, or False. If the node has a parent, it should call the match( ) function or the unmatch( ) function on its parent.

Each primitive operator has its own function for the match ( ) or unmatch( ) call. For example, DLY operator just simply call match( ) or unmatch( ) on its parent.

Figure 15:
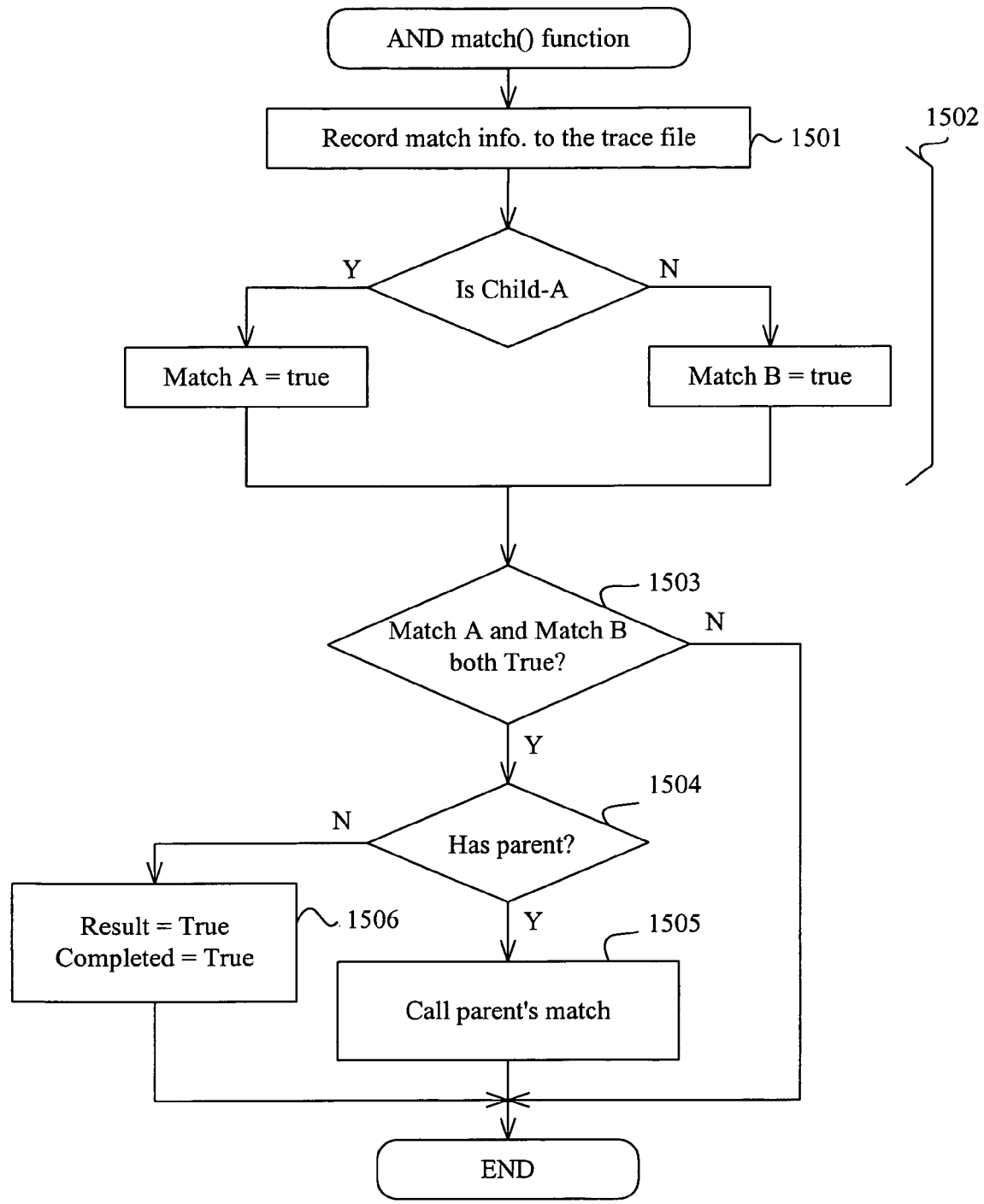
FIG. 15 illustrates a flowchart for the match( ) function of the AND operator case.

FIG. 15 illustrates a flowchart of the match( ) function for the AND operator case.

At 1501, the information for match condition is recorded to the trace file. The information includes the index of this bubble, index of the calling child bubble, simulation time, etc.

At the steps indicated at 1502, the process checks if the calling child is A or B, and set the MatchA or MatchB flag accordingly. These MatchA and MatchB flags are used to detect the AND condition for this bubble. At 1503, the process checks if both MatchA and MatchB flag are set. If so, it means that AND condition is met. If not, the function completes the process.

At 1504, the process checks if it has a parent. If there is a parent, it simply call the parent's match function at 1505. At 1506, since there is not a parent, the Result flag is set to True, and the Completed flag is set to True to inform the upper layer that the evaluation process is completed.

The operation flow of the evaluation process is explained in the description above. Here, the actual execution of an example temporal expression is described and the creation of the content of the trace file is reviewed.

Here, as an example, the following temporal expression is analyzed:

(@[0:1] A) AND (@[0:1] B)

Figure 16:
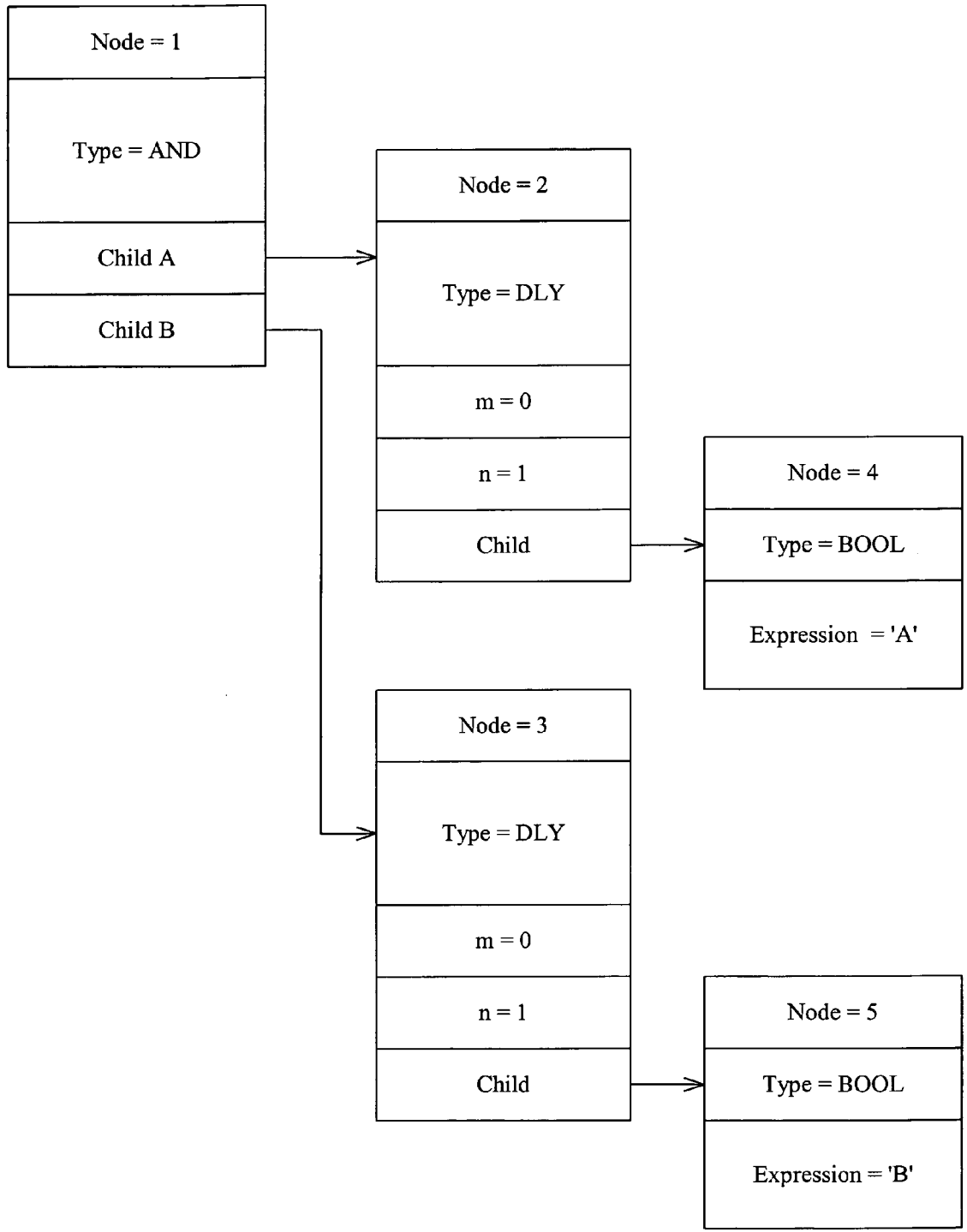
FIG. 16 illustrates a tree data structure for a sample expression.

The tree data structure of the expression above is shown in FIG. 16. FIG. 17 shows the activities of the Ready Queue and the Delay Queue during the evaluation process.

Referring to FIG. 17, at 1701, the initial bubble for the AND node is created. At 1702, as the result of executing the AND operation at 1214 (or FIG. 14), two child bubbles for the DLY node (Node=2, and Node=3) are created at the Ready Queue.

At 1703, two bubbles the for BOOL nodes (Node=4, and Node=5) are created in the Ready Queue. Also, two bubbles for the DLY nodes (Node=2, and Node=3) are created in the Delay Queue, as the result of DLY node evaluation 1213 (or FIG. 13).

Here, it is supposed that the Bool Expression 'A' returns True, but the Bool expression 'B' returns False. At 1704, as the result of Delay Queue operation, the bubble for the delay created at 1703 is moved to the Ready Queue at the next cycle. The From and To values are adjusted during the Delay Queue operation to 0 (zero). At 1705, as the result of executing the DLY operation 1213 (or FIG. 13), two bubbles for the Bool nodes (Node=4, and Node=5) are created in the Ready Queue.

Here, it is supposed that the Bool expression 'A' returns False and the Bool expression 'B' returns True. As the result, the temporal expression (@[0:1] A) AND (@[0:1] B) returns True as the result.

With the given evaluation flow, the trace file may have the following information. The right column shows the corresponding state of Delay Queue in FIG. 17, and the matching conditions.

```
1   [Tree Info. equivalent to FIG. 16 (omitted)]
2   NewBubble Index = 1 Parent = None Node = 1 Time = 0     1701
3   EvalBubble Index = 1 Node = 1 Time = 0
4   NewBubble Index = 2 Parent = 1 Node = 2 Time = 0        1702
5   NewBubble Index = 3 Parent = 1 Node = 3 Time = 0        1702
6   EvalBubble Index = 2 Node = 2 Time = 0
7   NewBubble Index = 4 Parent = 2 Node = 4 Time = 0        1703
8   NewBubble Index = 5 Parent = 2 Node = 2 Time = 0        1703
9   EvalBubble Index = 3 Node = 3 Time = 0
10  NewBubble Index = 6 Parent = 3 Node = 5 Time = 0        1703
11  NewBubble Index = 7 Parent = 3 Node = 3 Time = 0        1703
12  EvalBubble Index = 4 Node = 4 Time = 0
13  CallMatch Index = 2 Caller = 4 Node = 2 Time = 0        ('A' match)
14  CallMatch Index = 1 Caller = 2 Node = 1 Time = 0        (AND match-A)
15  FinishBubble Index = 4 Node = 4 Time = 0
16  FinishBubble Index = 2 Node = 2 Time = 0
17  EvalBubble Index = 6 Node = 5 Time = 0
18  CallUnmatch Index = 3 Caller = 6 Node = 3 Time = 0      ('B' unmatch)
19  CallUnmatch Index = 1 Caller = 3 Node = 1 Time = 0      (AND unmatch)
20  FinishBubble Index = 6 Node = 5 Time = 0
21  FinishBubble Index = 3 Node = 3 Time = 0
                   Delay Queue Operation 1704
22  EvalBubble Index = 5 Node = 2 Time = 1
23  NewBubble Index = 8 Parent = 6 Node = 4 Time = 1        1705
24  EvalBubble Index = 7 Node = 3 Time = 1
25  NewBubble Index = 9 Parent = 7 Node = 5 Time = 1        1705
26  EvalBubble Index = 8 Node = 4 Time = 1
27  CallUnmatch Index = 6 Caller = 8 Node = 2 Time = 1      ('A' unmatch)
28  CallUnmatch Index = 1 Caller = 6 Node = 1 Time = 1      (AND unmatch)
29  FinishBubble Index = 8 Node = 4 Time = 1
30  FinishBubble Index = 5 Node = 2 Time = 1
31  EvalBubble Index = 9 Node = 5 Time = 1
32  CallMatch Index = 7 Caller = 9 Node = 3 Time = 1        ('B' match)
33  CallMatch Index = 1 Caller = 7 Node = 1 Time = 1        (AND match-B)
34  Match Detected Index = 1 Node = 1 Time = 1              (Final AND match)
35  FinishBubble Index = 9 Node = 5 Time = 1
36  FinishBubble Index = 7 Node = 3 Time = 1
37  FinishBubble Index = 1 Node = 1 Time = 1
```

At the beginning of the file, the structure of the expression tree is saved (line 1). The information saved here is the same as the content shown in FIG. 16.

Then, the trace information of the temporal evaluation is saved. The information contains the creation of a new bubble, the evaluation of the bubble, parent's match/unmatch call from child, and the completion of the bubble evaluation.

With the given trace information, the evaluation history of a bubble can be completely reconstructed. However, it is very difficult for a person to understand the actual activities by reading the trace information (an example of which is as illustrated by above trace file lines 1 to 37).

Thus, an aspect of the presently preferred embodiment of the present invention is to provide an assertion evaluation debug view, where the assertion evaluation debug view provides a visualization of the recorded trace information.

Figure 18:
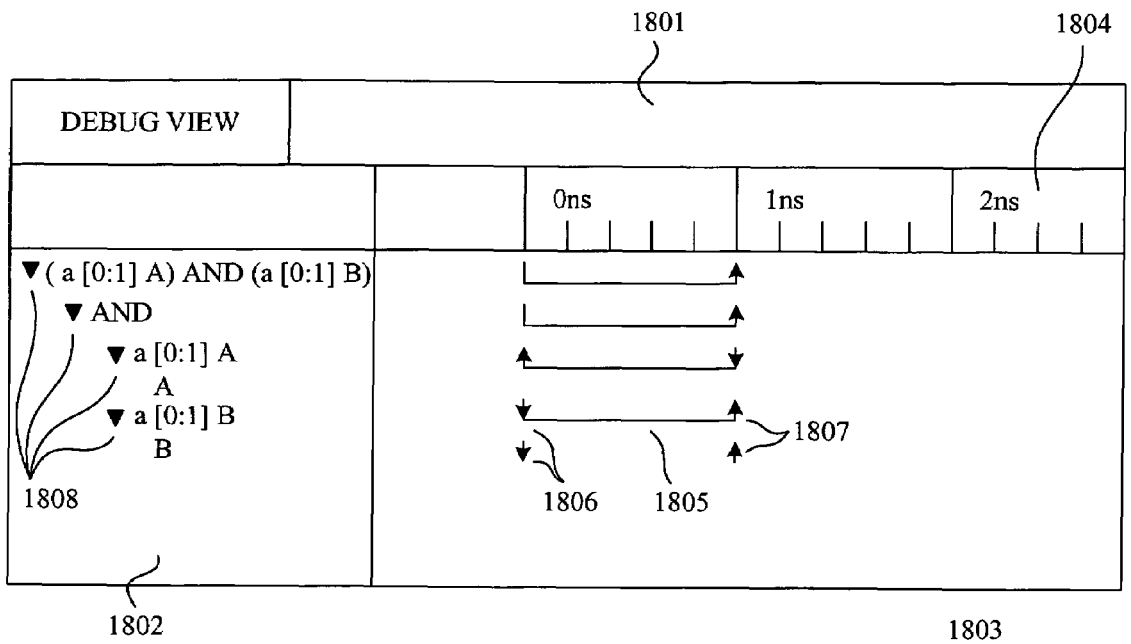
FIG. 18 illustrates an embodiment of the graphical representation of the present invention and the display of sample trace information thereon.

In one embodiment of the visualization of the trace information, referring to FIG. 18, there are two panels for the debug view. One panel is on the left and the other panel is on the right. The left panel is a tree widget to display a tree structure representation of the temporal expression. The nodes of the tree can be created from the tree information. The right panel is a display area to draw the successes and failures of the evaluation which is recorded in the trace information.

An overview of the debug window is shown in FIG. 18. Here, at the top of the window is a title bar 1801. The left panel shows a temporal expression tree 1802. The right panel shows a graphical presentation of the evaluation history of the temporal expression 1803. The top of right panel shows the simulation timeline 1804. The evaluation period for the respective expression is shown as a horizontal bar 1805. The unmatch condition is shown as down arrows 1806. The match condition is shown as upper arrows 1807.

For each bubble, there are records of its successes and/or failures. They are displayed in the right panel corresponding to the bubble tree. This panel has a timeline indicator on the top. Each success is represented by a upward green arrow, and each failure is represented by a downward red arrow. Every recorded item is drawn adjusted to its respective bubble node. There are different types of records. For instance, the life of a bubble can be represented by a gray line which starts at the start time of the bubble and ends at the end time of the bubble.

Figure 19:
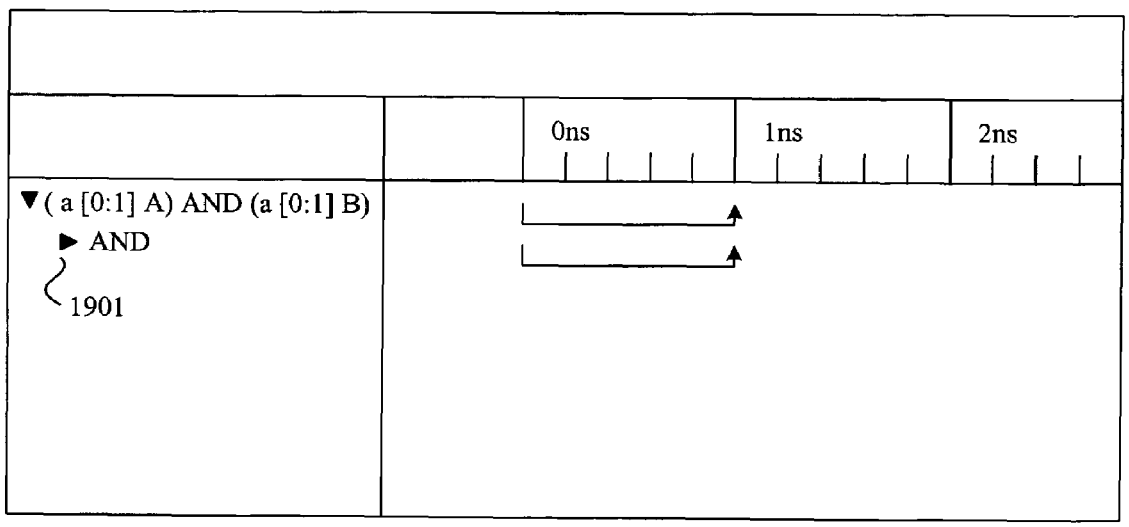
FIG. 19 illustrates another display of sample trace information.

In the left panel 1802, each tree entry can have a triangle mark 1808. By clicking this mark, the respective lower hierarchy can be displayed. This graphical representation helps to show the section of interest of the evaluation information. FIG. 19 shows a window where only two levels are shown. The triangle mark at second line 1901 changes the shape to indicate there are further levels. The folded level can be unfolded again by re-clicking the triangle mark.

There are also other types of assertion expressions that can be displayed. The following are descriptions of certain ones of these assertion expressions.

A display of concatenated sequences can be shown, where a sample concatenated sequences would be:

@[1:2] A @[2:3] B

This expression means that the first term '@[1:2] A' is evaluated, then when the first term matches, the following '@[2:3] B' will be evaluated. It is possible that the evaluation of second term can take multiple times when the first term matches multiple times. When this multiple evaluation happens, multiple evaluation bubbles of the second term is created, and multiple trace information will be created within the trace file.

Figure 20:
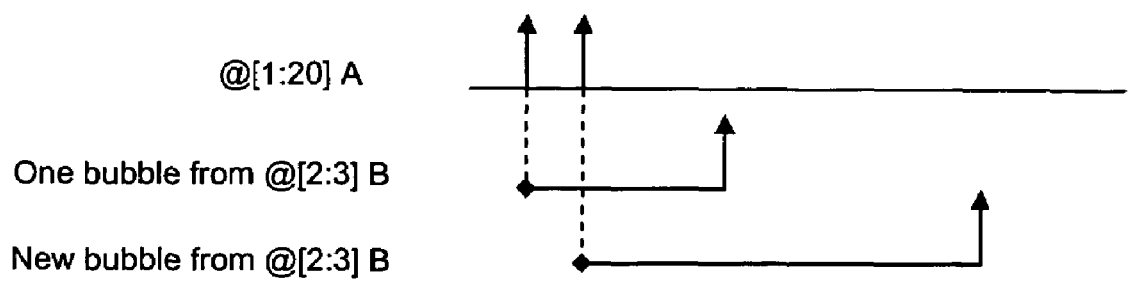
FIG. 20 is an illustration of a graphical representation of a temporal expression.

Referring to FIG. 20, suppose that the first term '@[1:2] A' matches on both cycle #1 and #2, then at the time of #1, a bubble of "@[2:3]" will be generated, and at #2, another bubble of "@[2:3]" will be generated. In order to show such a case, we use dashed lines to show that where the bubbles come from. It can help the user to have a better understanding of the bubble tree, especially when it is a complex one.

A display of mutex expressions can also be presented. Mutexes are mutual objects in multi-threading programs and they can be represented and performed in assertion expressions. In fact, there are a type of assertion expression whose task is to grab the mutex. The mutex can only be hold by one and only one assertion instance. When an assertion expression tries to grab the assertion instance and finds it that it is already hold by another instance, it has to wait until the other instance releases it. In such display, the waiting period and the possessing period can be graphically shown by different colors, and the mutex name can be shown on the left bubble tree.

A display of async expressions can also be presented. The assertion evaluation can be driven by many clocks. We also show the clock domain on the left bubble tree so that the user can know which clock is driving the evaluation process.

Note that the trace information can be stored in a number of formats, including the XML format such that it can be easily displayed in other ways.

The above description is included to illustrate the operation of the preferred embodiments and is not meant to limit the scope of the invention. Where the description refers to "one" embodiment and/or "another" embodiment, it will be understood that the description is not necessarily referring to different embodiments. The scope of the invention is to be limited only by the following claims. From the above discussion, many variations will be apparent to one skilled in the relevant art that would yet be encompassed by the spirit and scope of the invention.

We claim:

1. A method for displaying assertion evaluation information of a temporal expression comprising:

generating a data structure for processing a temporal expression;

evaluating the temporal expression and generating evaluation information representative of processing steps in the evaluation of the temporal expression; and displaying a graphical representation of the evaluation information of the temporal expression, wherein said graphical representation allows for a user to selectively display the evaluation information for each processing step in the evaluation of the temporal expression, wherein the graphical representation having a first area and a second area, and wherein the data structure is displayed in the first area and the evaluation information is displayed in the second area, wherein said data structure is a bubble tree having a plurality of bubbles and wherein in said second area a bubble-specific timeline for each bubble, whose temporal expression name is unfolded in the first area, is displayed adjacent to respective temporal expression name in the data structure in the first area.

2. The method of claim 1, wherein said first area provides a user-selectable, foldable tree structure representative of the temporal expression at different hierarchical levels.

3. The method of claim 1 wherein in the generating of evaluation information step, the generated evaluation information includes records of successes and failures, and wherein a success is-displayed by a success symbol and a failure is displayed by a failure symbol.

4. The method of claim 2 wherein in the generating of evaluation information step, the generated evaluation information includes records of successes and failures, and wherein a success is displayed by a success symbol and a failure is displayed by a failure symbol.

5. The method of claim 1 wherein the evaluating of the temporal expression is within a general purpose programming language.

6. A method for displaying assertion evaluation information of a temporal expression, wherein the evaluating of the temporal expression is within a general purpose programming language, comprising:

generating a data structure for processing a temporal expression;

evaluating the temporal expression and generating evaluation information representative of processing steps in the evaluation of the temporal expression; and displaying a graphical representation of the evaluation information of the temporal expression, wherein said graphical representation allows for a user to selectively display the evaluation information for each processing step in the evaluation of the temporal expression, wherein the graphical representation having a first area and a second area, and wherein the data structure is displayed in the first area and the evaluation information is displayed in the second area, wherein said data structure is a bubble tree having a plurality of bubbles and wherein in said second area a bubble-specific timeline for each bubble, whose temporal expression name is unfolded in the first area, is displayed adjacent to respective temporal expression name in the data structure in the first area.

7. The method of claim 6, wherein said first area provides a user-selectable, foldable tree structure representative of the temporal expression at different hierarchical levels.

8. The method of claim 6 wherein in the generating of evaluation information step, the generated evaluation information includes records of successes and failures, and wherein a success is-displayed by a success symbol and a failure is displayed by a failure symbol.

9. The method of claim 7 wherein in the generating of evaluation information step, the generated evaluation information includes records of successes and failures, and wherein a success is displayed by a success symbol and a failure is displayed by a failure symbol.

10. A method for displaying assertion evaluation information of a temporal expression comprising:

generating a data structure for processing a temporal expression;

evaluating the temporal expression and generating evaluation information representative of processing steps in the evaluation of the temporal expression; and displaying a graphical representation of the evaluation information of the temporal expression, wherein said graphical representation allows for a user to selectively display the evaluation information for each processing step in the evaluation of the temporal expression, and wherein the graphical representation having a first area and a second area, wherein said first area provides a user-selectable, foldable tree structure representative of the temporal expression at different hierarchical levels, and wherein said data structure is a bubble tree having a plurality of bubbles and in said second area a bubble-specific timeline for each bubble, whose temporal expression name is unfolded in the first area, is displayed adjacent to respective temporal expression name in the tree structure in the first area.

11. The method of claim 10 wherein in the generating of evaluation information step, the generated evaluation information includes records of successes and failures, and wherein a success is represented by a success symbol and a failure is represented by a failure symbol.

12. The method of claim 10 wherein the evaluating of the temporal expression is within a general purpose programming language.

* * * * *